(12) United States Patent
Nakamura et al.

(10) Patent No.: US 8,029,717 B2
(45) Date of Patent: Oct. 4, 2011

(54) NANOIMPRINT METHOD AND APPARATUS

(75) Inventors: Kazuya Nakamura, Tokyo (JP); Nobuo Imaizumi, Tokyo (JP); Yoshihito Hiyama, Aomori (JP); Ryutaro Maeda, Ibaraki (JP); Hiroshi Goto, Ibaraki (JP)

(73) Assignee: Namiki Seimitsu Houseki Kabushiki Kaisha (JP)

( * ) Notice: Subject to any disclaimer, the term of this patent is extended or adjusted under 35 U.S.C. 154(b) by 212 days.

(21) Appl. No.: 12/063,088

(22) PCT Filed: Aug. 17, 2006

(86) PCT No.: PCT/JP2006/316144
§ 371 (c)(1),
(2), (4) Date: Aug. 27, 2009

(87) PCT Pub. No.: WO2007/020962
PCT Pub. Date: Feb. 22, 2007

(65) Prior Publication Data
US 2010/0065986 A1    Mar. 18, 2010

(30) Foreign Application Priority Data

Aug. 17, 2005  (JP) .................................. 2005-236354
May 18, 2006  (JP) .................................. 2006-138720

(51) Int. Cl.
*B29C 59/00* (2006.01)
(52) U.S. Cl. ........ 264/293; 264/310; 264/175; 264/280; 264/281; 264/284; 264/313; 264/316; 425/177; 425/293; 118/667; 118/232; 118/233

(58) Field of Classification Search ................... 264/293, 264/310, 175, 280, 281, 284, 313, 316; 425/177, 425/392; 118/667, 232, 233
See application file for complete search history.

(56) References Cited

U.S. PATENT DOCUMENTS
2004/0200368 A1   10/2004 Ogino et al.

FOREIGN PATENT DOCUMENTS
EP          1003078 A2    5/2000
(Continued)

OTHER PUBLICATIONS

Tan et al.; Roller nanoimprint lithography; Journal of Vacuum Science & Technology. B; American Vacuum Society; 1998; vol. 16, No. 6; pp. 3926-3928.

(Continued)

*Primary Examiner* — Saeed M Huda
(74) *Attorney, Agent, or Firm* — Studebaker & Brackett PC; Donald R. Studebaker

(57) ABSTRACT

There is provided a nanoimprint apparatus. The nanoimprint apparatus transfers a pattern formed on a surface of a mold to a transfer layer which is formed partially or entirely on a side surface of a substantially cylindrical or columnar substrate. The nanoimprint apparatus includes: a first jig which is in contact with the substrate 102; a second jig which rotatably supports the first jig; a press unit which is connected to the second jig to press the substrate on the mold 104 through the first and second jigs; and a movable holding unit which holds the mold and moves the mold 104 in a direction substantially perpendicular to a pressing force.

1 Claim, 19 Drawing Sheets

FOREIGN PATENT DOCUMENTS

| | | |
|---|---|---|
| JP | 5222504 | 8/1993 |
| JP | 8276494 | 10/1996 |
| JP | 10109314 | 4/1998 |
| JP | 2000141481 | 5/2000 |
| JP | 2002001812 | 1/2002 |
| JP | 2003001706 | 1/2003 |
| JP | 2003025431 | 1/2003 |
| JP | 2004288811 | 10/2004 |
| JP | 2005012040 | 1/2005 |

OTHER PUBLICATIONS

International Search Report; PCT/JP2006/316144; Nov. 28, 2006.

FIG.3
(a) 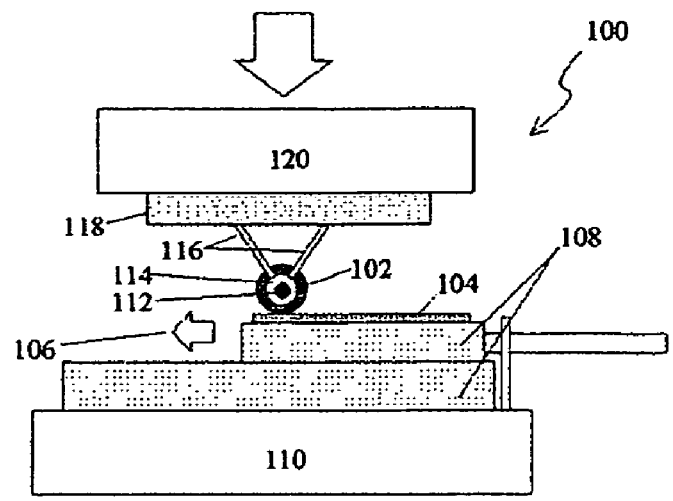
(b) 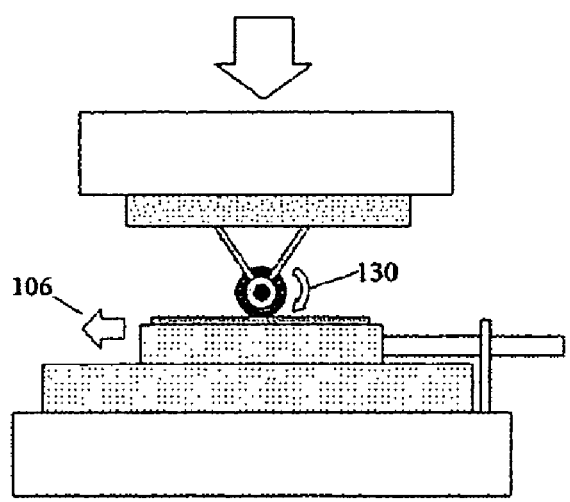
(c) 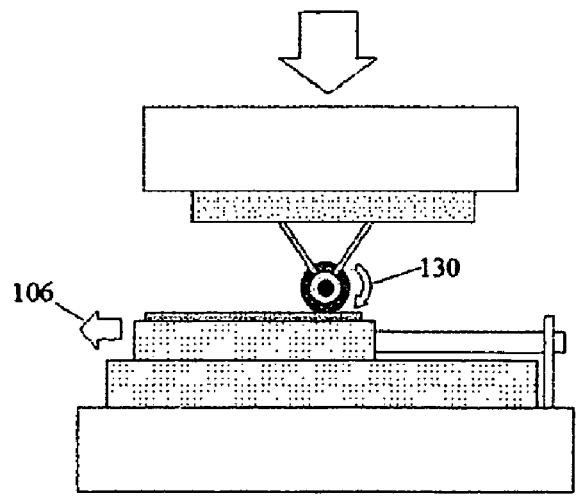

FIG.4
(a)
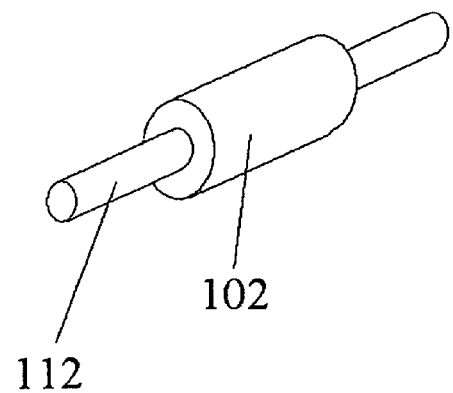
(b)
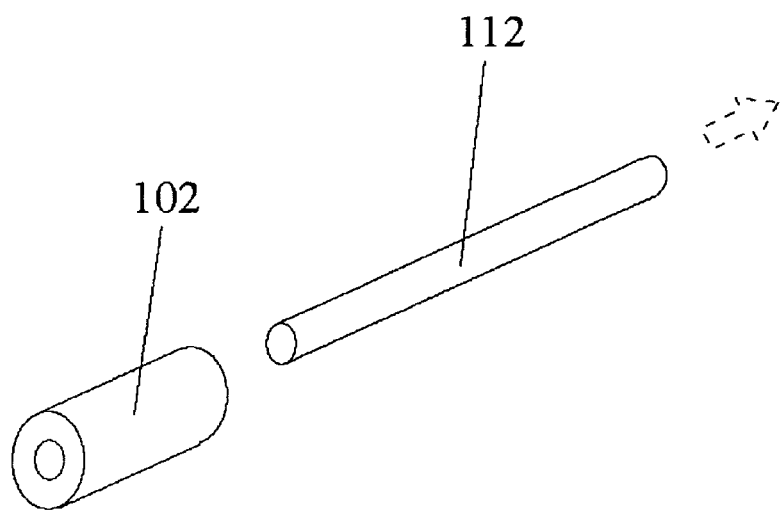

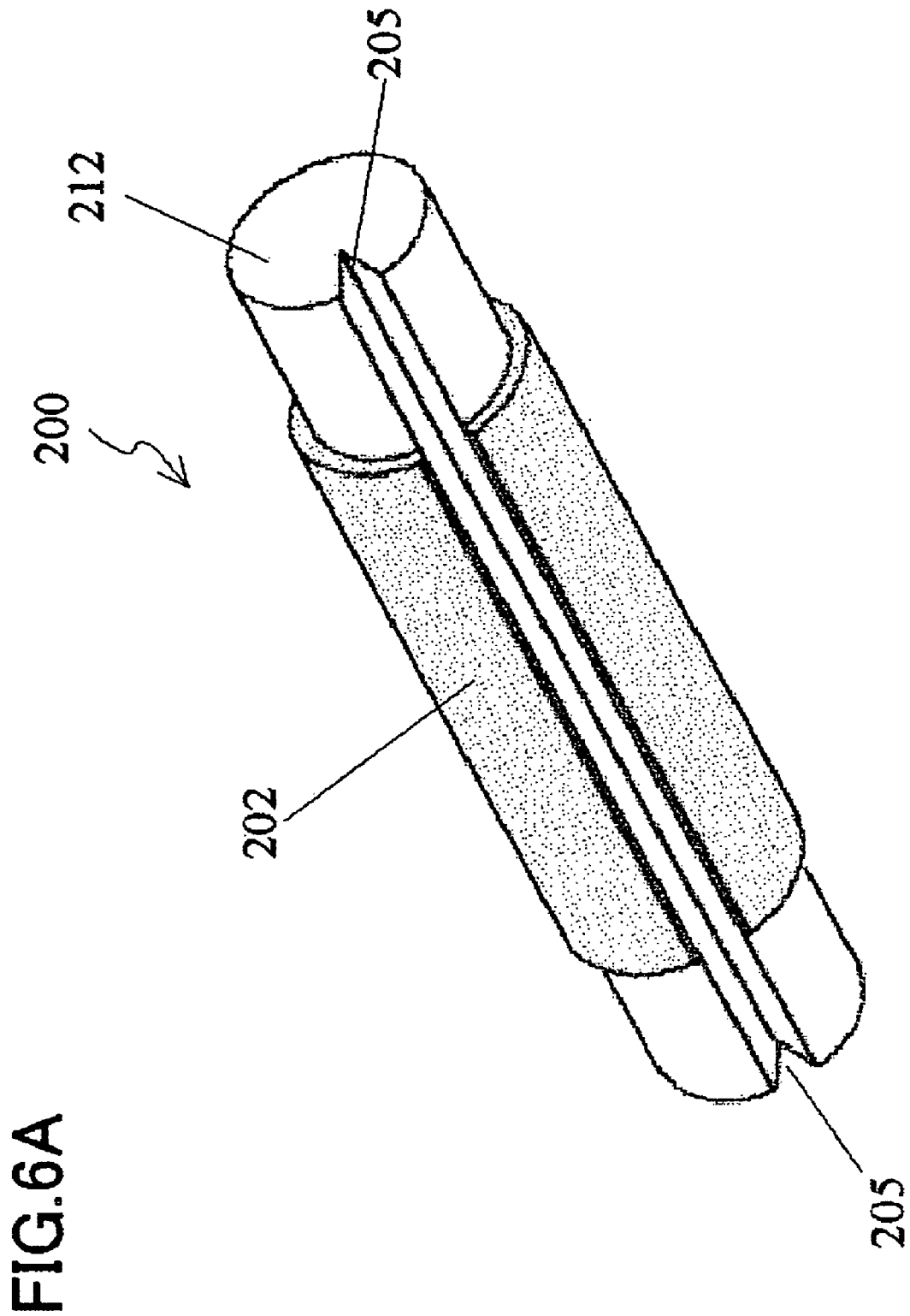

FIG.8
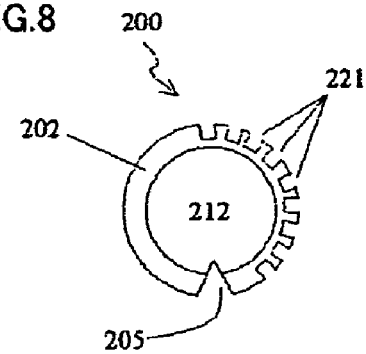
(a)
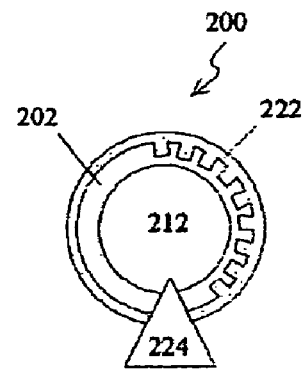
(b)
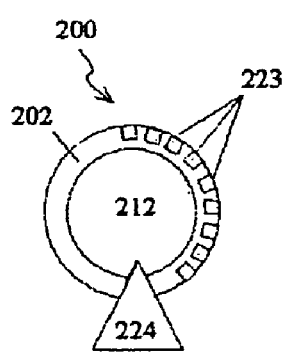
(c)
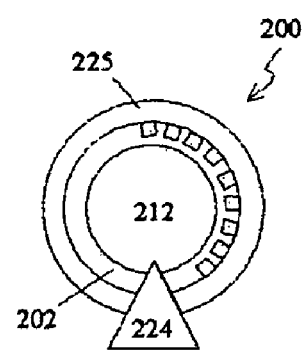
(d)
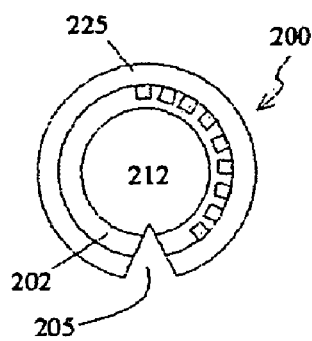
(e)

FIG.9
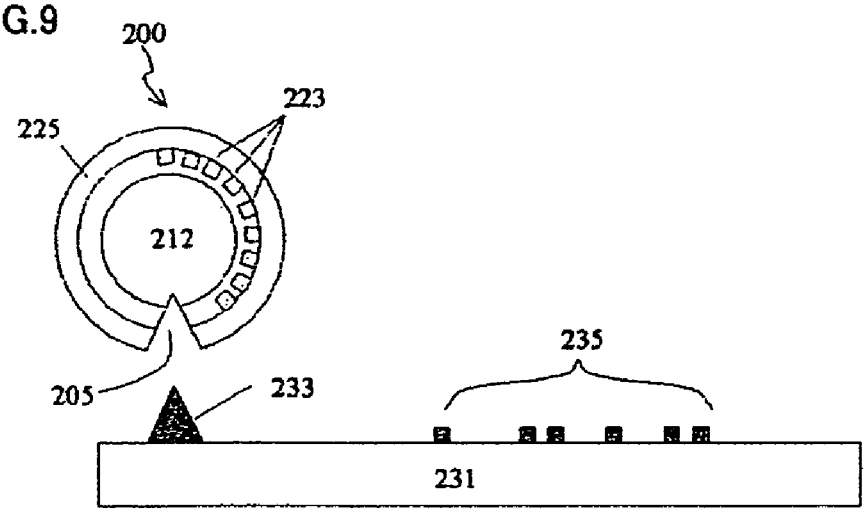
(a)
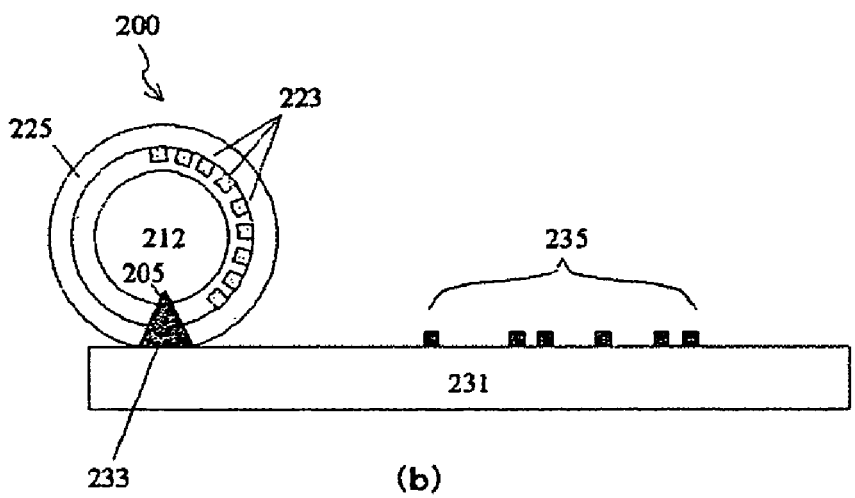
(b)
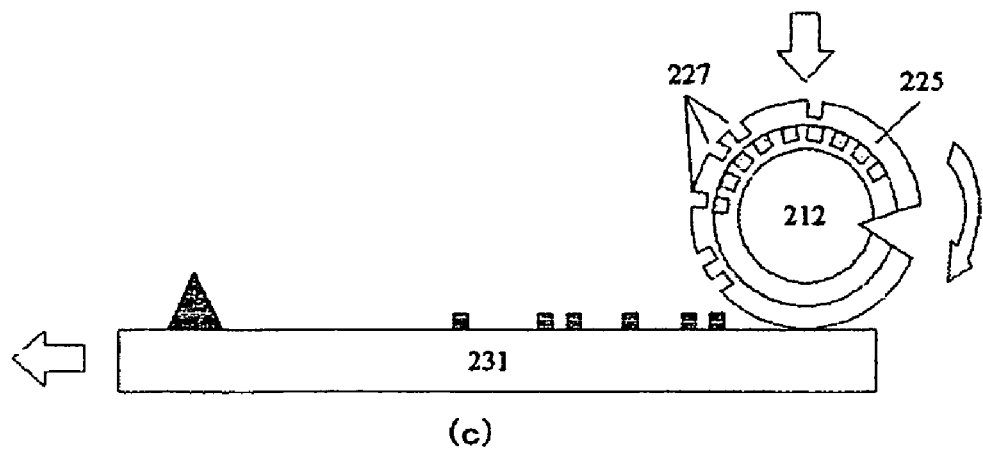
(c)

FIG.11
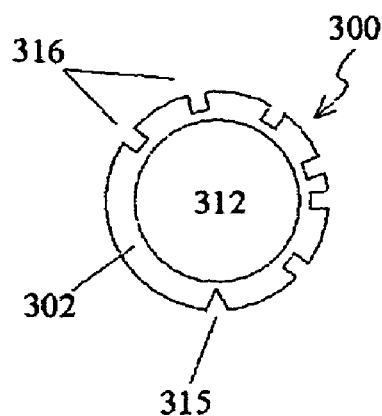
(a)
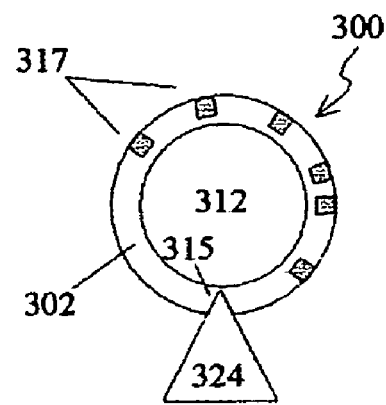
(b)
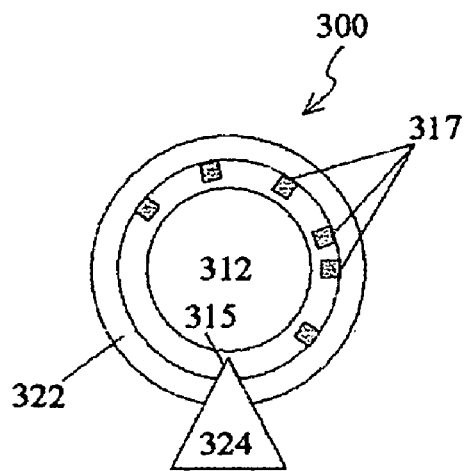
(c)

FIG.14
(a)
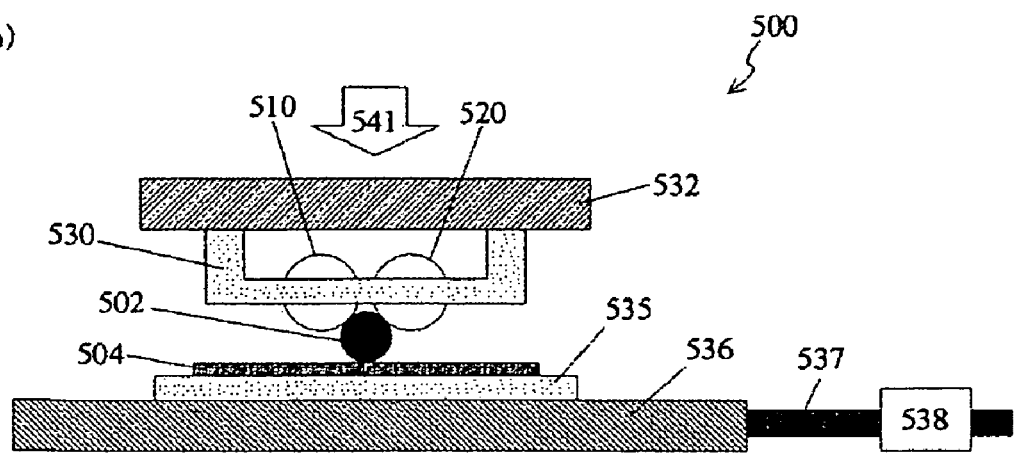
(b)
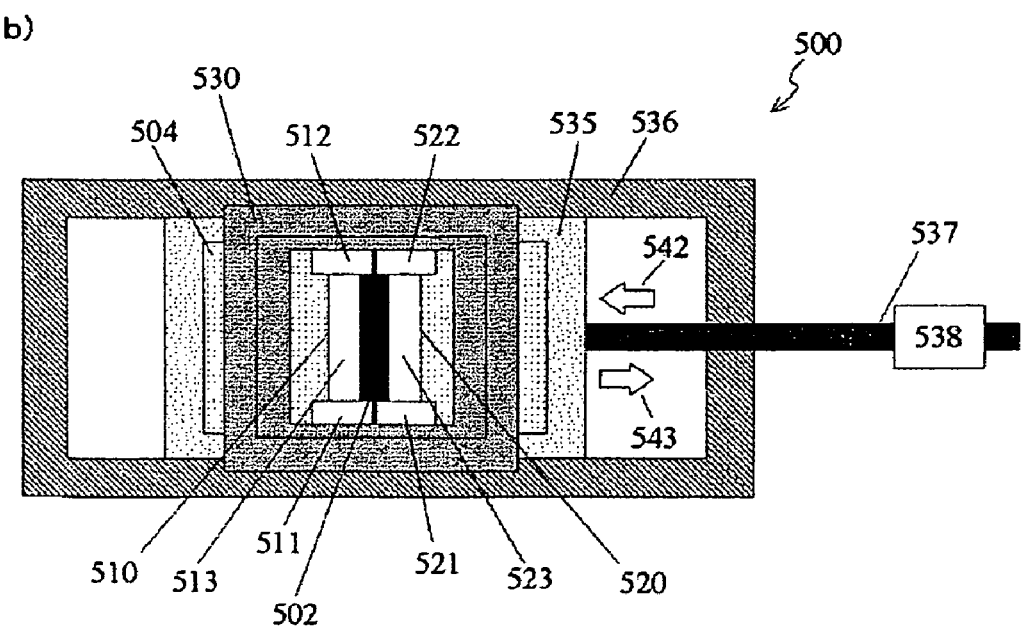

NANOIMPRINT METHOD AND APPARATUS

TECHNICAL FIELD

The present invention relates to a nanoimprint technology, and more particularly, to a nanoimprint technology for transferring a pattern to a transfer layer formed partially or entirely on a cylindrical side surface and a nanoimprint technology suitable for fabricating a multi-layered circuit board.

RELATED ART

Recently, much attention has been paid to a nanoimprint technology such as a process for manufacturing a three-dimensional ultrafine nano-structure. As an example of the nanoimprint technology, in a thermal nanoimprint process, a finely processed mold is heated and pressed on a to-be-processed material (resin or glass), so that a pattern of the mold is transferred to the to-be-processed material. Thermal nanoimprint process is a technique for forming the nano-structure by performing a simple process of heating and pressing the mold on the material. The nanoimprint technology is a developing technology that is actively researched and developed by public research institutes and private companies. A nanoimprint lithography is a technology that does not require for an expensive exposure apparatus and an expensive mask. Therefore, the nanoimprint lithography can inexpensively be used for an ultrafine process, so that it is expected to be used for various applications such as an optical device, a recording medium, an electronic device, and a bio-chip.

Patent Document 1: Japanese Patent Application Laid-Open No. 2004-288811

DISCLOSURE OF THE INVENTION

Problems to be Solved by the Invention

If a circuit pattern can be formed on a transfer layer formed on a side surface of a cylindrical substrate by using a nanoimprint technology, various useful applications can be expected. For example, if a coil-shaped conductive circuit is formed on the cylindrical side surface, the cylindrical substrate can be used as a stator of a motor. However, in the prior art, the nanoimprint cannot be implemented on the cylindrical side surface. In addition, in a case where a multi-layered circuit board is manufactured by using the nanoimprint, the nanoimprint needs to be performed without position misalignment between upper and lower circuit patterns. However, there is no interlayer position alignment technique adaptable for the nanoimprint on the cylindrical side surface. The inventors contrive the present invention in order to solve the above-described problems.

Means for Solving the Problems

According to an aspect of the present invention, there is provided a nanoimprint method, wherein a to-be-molded body in which a transfer layer is formed partially or entirely on a conic or cylindrical side surface is rolled and moved on a mold in a state that the to-be-molded body is pressed on the mold, so that a pattern formed on a surface of the mold is transferred to the transfer layer.

According to another aspect of the present invention, there is provided a method of fabricating a molded body in which a pattern is formed partially or entirely on a conic or cylindrical side surface thereof, comprising a step of rolling and moving the to-be-molded body in which a transfer layer is formed on the surface on a mold in a state that the to-be-molded body is pressed on the mold, so that the pattern formed on a surface of the mold is transferred to the transfer layer.

The shape of the transfer layer is not limited to a shape formed partially or entirely on an accurately conic or cylindrical side surface, but it includes a shape formed partially or entirely on a substantially conic or cylindrical side surface.

According to still another aspect of the present invention, there is provided a nanoimprint apparatus for transferring a pattern formed on a surface of a mold to a transfer layer which is formed partially or entirely on a side surface of a cylindrical or columnar substrate, wherein the nanoimprint apparatus comprises: a first jig which is in contact with the substrate; a second jig which rotatably supports the first jig; a press unit which is connected to the second jig to press the substrate on the mold through the first and second jigs; and a movable holding unit which holds the mold and moves the mold in a direction substantially perpendicular to a pressing force. The shape of the substrate is not limited to an accurately cylindrical or columnar shape, but it includes a substantially cylindrical or columnar shape.

In the nanoimprint method, the method of fabricating a molded body, and the nanoimprint apparatus according to the above aspects of the present invention, the nanoimprint to the transfer layer that is formed partially or entirely on the substantially conical or cylindrical side surface can be implemented. According to the applicant's search, this technology is not laid open at the time of filing the Patent Application. If the nanoimprint can be implemented in such a shape, various applications can be expected. For example, circuit wires (interconnections) can be formed on a circuit board in a shape of a cylindrical side surface, or grooves can be formed on a surface of a shaft-shaped member. As an example of the latter application, fine grooves can be formed on a surface of a shaft for a dynamic pressure shaft bearing. In addition, as another example of applications, a pattern for decoration may be simply transferred.

In the above aspect, the first jig may be a shaft-shaped jig that penetrates through the substrate to be in internal contact with the substrate, and the second jig may be a shaft-bearing-shaped jig that rotatably supports the shaft-shaped jig. In the construction, although the transfer layer is formed partially or entirely on the side surface of the cylindrical or columnar substrate of the to-be-molded body, since a pressing mechanism can press the transfer layer on the surface to the mold through the shaft that penetrates the substrate, the transfer layer can be pressed to the mold in a state that the pressing mechanism is not directly in contact with the transfer layer. Accordingly, the nanoimprint can be performed in a state that the transfer layer is not deformed due to the contact between the pressing mechanism and the transfer layer. In addition, since the to-be-molded body is rotatably supported by the shaft bearings, if the mold is moved by the movable holding unit, the to-be-molded body is rolled due to a frictional force between the mold and the surface of the to-be-molded body in a state that the to-be-molded body is pressed on the mold. Therefore, according to the movement of the mold, a portion of the transfer layer where a pattern is not yet transferred is sequentially pressed on a new portion of the mold, so that the pattern of the plate mold can be transferred to the transfer layer that is formed partially or entirely on the cylindrical side surface. The mold is not limited to the plate mold, but a curved-surface mold may be adapted to the nanoimprint apparatus according to the above aspects of the present invention.

In addition, in the above aspect, the first jig may be a roller-shaped jig that is in external contact with the substrate, and the second jig may be a frame that rotatably supports the roller-shaped jig. Preferably, at least two roller-shaped jigs are provided. Accordingly, the to-be-molded body can be stably supported by the two roller-shaped jigs and the mold. In addition, preferably, the roller-shaped jig has a structure in which end portions thereof are in contact with the substrate. According to the construction, since a contact area between the roller jig and the to-be-molded body can be reduced, it is possible to prevent unnecessary stress from being exerted on the transfer layer, which the pattern has just been transferred to, due to a contact between the jig and the transfer layer.

According to further still another aspect of the present invention, there is provided a nanoimprint method of transferring a pattern by contacting and pressing a to-be-molded body on a mold, comprising steps of: preparing a transfer layer having a first engagement structure and the mold having a second engagement structure that is to be engaged with the first engagement structure; contacting the transfer layer with the mold so that the first engagement structure is engaged with the second engagement structure; and transferring the pattern of the mold to the transfer layer by exerting a pressure to a contact area between the mold and the transfer layer after contacting.

According to further still another aspect of the present invention, there is provided a method of fabricating a molded body in which a pattern is formed on a surface thereof, comprising steps of: preparing a to-be-molded body having a first engagement structure and a mold having a second engagement structure that is to be engaged with the first engagement structure; contacting the to-be-molded body with the mold so that the first engagement structure is engaged with the second engagement structure; and transferring the pattern of the mold to the to-be-molded body by exerting a pressure to a contact area between the to-be-molded body and the mold after contacting.

In the nanoimprint method and the method of fabricating a molded body according to the above aspects of the present invention, after the position alignment between the to-be-molded body and the mold is performed by using engagement structures of the to-be-molded body and the mold, the nanoimprint is performed. Accordingly, the position where the pattern is transferred to the to-be-molded body can be accurately controlled.

Preferably, the first engagement structure has a concave shape in which an opening width is gradually decreased in the inward direction from an opening end. In addition, preferably, the second engagement structure has a convex shape in which a cross section area is increased in the direction from a distal end to a base portion. Therefore, as an example of the first engagement structure, conic, trigonal-pyramid, or quadrangular-pyramid concave structures or groove (furrows) structures having a cross section of a triangle or a trapezoid may be used. Similarly, as an example of the second engagement structure, conic, trigonal-pyramid, or quadrangular-pyramid protrusions or convex striae (striated line or ridgeline) having a cross section of a triangle or a trapezoid may be used. Due to such shapes, there is an advantage in that the first and second engagement structures can be easily engaged with each other and smoothly disengaged from each other.

In the to-be-molded body, the transfer layer may be formed partially or entirely on the conic or cylindrical side surface of the to-be-molded body. In this case, in the transfer step, the to-be-molded body is rolled and moved on the mold in a state that the to-be-molded body is pressed on the mold, so that the pattern of the mold can be transferred to the transfer layer.

According to further still another aspect of the present invention, there is provided a method of fabricating a multi-layered circuit board. In the method of fabricating a multi-layered circuit board, at least two circuit pattern layers are formed by using a nanoimprint method. The method comprises: a step of preparing a first transfer layer having a first engagement structure and a first mold having a second engagement structure that is formed to be engaged with the first engagement structure; a first contact step for contacting the first transfer layer with the first mold so that the first engagement structure is engaged with the second engagement structure; a first transfer step for transferring a pattern of the first mold to the first transfer layer by exerting a pressure to a contact area between the first transfer layer and the first mold after the first contact step; a step of filling the transferred pattern with a conductor; a step of forming a second transfer layer on the first transfer layer where the conductor pattern is formed so that the first engagement structure is not removed; a step of preparing a second mold having a third engagement structure which is formed to be engaged with the first engagement structure; a second contact step for contacting the second transfer layer with the second mold so that the first engagement structure is engaged with the third engagement structure; and a second transfer step for transferring a pattern of the second mold to the second transfer layer by exerting a pressure to a contact area between the second transfer layer and the second mold after the second contact step.

According to the method of fabricating a multi-layered circuit board, since the pattern is transferred after the engagement structures are aligned in each layer, the nanoimprint can be performed in the state that the position alignment between upper and lower patterns can be accurately implemented.

A plate transfer layer may be used, and a transfer layer that is formed partially or entirely on a substantially conic or cylindrical side surface may be used. In the latter case of the transfer layer, after the engagement structures are firstly aligned, the transfer layer is rolled and pressed on the mold, so that the pattern of the mold can be transferred to the transfer layer. According to the method of fabricating a multi-layered circuit board, the position alignment between the layers can be implemented for a multi-layered circuit board which is formed partially or entirely on a substantially conic or cylindrical side surface as well as a plate multi-layered circuit board.

In the step of filling the transferred pattern with the conductor and the step for forming the second transfer layer, it is preferable that the first engagement structure is engaged with a protection member so as not to be removed the first engagement structure.

According to further still another aspect of the present invention, there is provided a method of fabricating a multi-layered circuit board, wherein at least two layers of circuit patterns are formed by using a nanoimprint method, and wherein in nanoimprint for forming a first layer, a second engagement structure that is to be engaged with a first engagement structure provided to a mold of a second layer is formed on a transfer layer of the first layer.

According to further still another aspect of the present invention, there is provided a nanoimprint mold having a to-be-transferred pattern which is to be transferred to a to-be-molded body and having a convex structure which is to be engaged with a position-alignment concave portion provided to the to-be-molded body.

According to further still another aspect of the present invention, there is provided a nanoimprint mold set used for fabricating a multi-layered circuit board, wherein at least two molds include to-be-transferred patterns which are to be transferred to a to-be-molded body and convex portions that are to be engaged with position-alignment concave portions provided to the to-be-molded body.

According to further still another aspect of the present invention, there is provided a nanoimprint mold set having first and second nanoimprint molds, wherein the first mold includes a position-alignment structure transfer portion for transferring a position-alignment concave structure to a to-be-molded body, and wherein the second mold includes a convex structure that is to be engaged with the transferred concave structure.

According to further still another aspect of the present invention, there is provided a to-be-molded body for nanoimprint, the to-be molded body having an engagement structure that is to be engaged with an engagement structure of a mold for transferring a pattern to the to-be-molded body.

According to further still another aspect of the present invention, there is provided a nanoimprint apparatus for transferring a pattern formed on a surface of a plate mold to a to-be-molded body in which a transfer layer is formed partially or entirely on a side surface of a substantially cylindrical or columnar substrate, wherein the nanoimprint apparatus comprises: a mold fastening mechanism which fastens and holds the plate mold; a movable stage which horizontally moves the plate mold together with the mold fastening mechanism; a press machine which presses the to-be-molded body loaded on the plate mold onto the plate mold; and an elastic layer disposed between the press machine and the to-be-molded body, the elastic layer having a width equal to or larger than an longitudinal width of the to-be-molded body, the elastic layer being made of an elastic material that is softer than the transfer layer.

According to further still another aspect of the present invention, there is provided a method of fabricating a cylindrical or columnar molded body in which a pattern is formed partially or entirely on a side surface thereof by nanoimprint, the method comprising steps of: preparing a to-be-molded body in which a transfer layer is formed partially or entirely on a side surface of a substantially cylindrical or columnar substrate and a plate mold for nanoimprint in which a to-be-transferred pattern is formed on a surface thereof; fastening the mold on a stage that is horizontally movable; loading the to-be-molded body on the mold; pressing the to-be-molded body on the mold through an elastic layer having a width equal to or larger than an longitudinal width of the to-be-molded body and being made of an elastic material softer than the transfer layer; moving the mold by the stage in a state that the to-be-molded body is continuously pressed on the mold, so that the to-be-molded body is rolled and moved.

The nanoimprint apparatus and the method of fabricating a molded body using nanoimprint are particularly suitable for a flexible cylindrical or columnar to-be-molded body. If the cylindrical or columnar to-be-molded body has a short diameter or is made of a soft substrate material, the to-be-molded body can be easily bent. If the to-be-molded body is bent during the nanoimprint, the pressing force exerted on the contact portion between the transfer layer and the mold becomes non-uniform according to the positions thereof, and thereby a good pattern cannot be transferred. According to the applicant's search, although the columnar substrate is made of a hard material such as stainless steel, in case of the substrate having a diameter of 0.45 mm or less, the influence of the bending is not negligible during the nanoimprint.

However, according to the nanoimprint apparatus and the method of fabricating a molded body using the nanoimprint, since the to-be-molded body is pressed on the mold through the elastic layer having a width equal to or larger than a longitudinal width of the to-be-molded body, the elastic layer can compensate for non-uniformity of the pressing force, so that the cylindrical or columnar to-be-molded body can be uniformly pressed on the mold along the direction of the shaft. Therefore, during the pressing, the possibility that the to-be-molded body is bent is much lowered, so that an accurately transferred pattern can be implemented. In order to further improve the uniformity of the pressing force, it is preferable that a portion of the mold on which the to-be-molded body is pressed through the elastic layer is a planar surface having a width equal to or larger than a longitudinal width of the to-be-molded body.

In the nanoimprint apparatus and the method of fabricating a molded body using the nanoimprint, since the to-be-molded body is rolled and moved on the mold to transfer the pattern to the entire surface of the transfer layer, the portion of the transfer layer of the to-be-molded body where the pattern is completely transferred is rolled to be in contact with the pressing machine while the nanoimprint process is performed. If the portion of the pressing machine which the transfer layer is directly in contact with is made of a hard material, the transferred and molded pattern may be broken or destructed at the time that the pattern is in contact with the pressing machine. However, according to the nanoimprint apparatus and the method of fabricating a molded body using the nanoimprint, since the elastic layer disposed between the pressing machine and the transfer layer is made of a elastic material that is softer than the transfer layer, when the transfer layer is pressed on the elastic layer according to the rolling of the to-be-molded body, the pattern formed on the transfer layer is not easily destructed. Accordingly, in the nanoimprint apparatus and the method of fabricating a molded body using the nanoimprint, a stably and accurately transferred pattern can be implemented. As an example of the elastic material, a silicon rubber may be used.

According to the nanoimprint apparatus and the method of fabricating a molded body using nanoimprint, a fine pattern can be stably transferred to a flexible cylindrical or columnar to-be-molded body having a very short diameter.

In the scope of the present invention, the aforementioned features, the features defined by the claims at the time of filing of the Patent Application, and any combination thereof are included.

BEST MODE FOR CARRYING-OUT THE INVENTION

Hereinafter, preferred embodiments of the present invention will be described with reference to the accompanying drawings.

First Embodiment

FIG. 1 is a conceptual side view illustrating a nanoimprint apparatus 100 according to a first embodiment of the present invention. The nanoimprint apparatus 100 is an apparatus for transferring a pattern formed on a plate mold 104 to a cylindrical substrate 102 in which a transfer layer is formed on a cylindrical side surface thereof. The transfer layer is made of a thermoplastic resin, and the mold 104 is a Ni mold. The nanoimprint apparatus 100 includes a stage 108 which fastens and holds the mold 104 and moves the mold 104 in the leftward direction 106 of the figure and a heater 110 which heats the mold 104. In addition, the nanoimprint apparatus 100 further includes a shaft 112 which penetrates through an inner hole of the cylindrical substrate 102 to fix the cylindrical substrate 102, shaft bearings 114 which enclose bearings to rotatably support the shaft 112, a cylindrical-member fastening jig 118 which fastens the shaft bearings 114 with supporting bars 116, and a press machine 120. The shaft 112, the shaft bearings 114, and others are illustrated in an enlarged perspective view of FIG. 2.

The press machine 120 exerts load in a direction perpendicular to a surface of the mold 104 so as to press the cylindrical substrate 102 together with the shaft 112 on the mold 104 through the cylindrical-member fastening jig 118 and the shaft bearings 114. The heater 110 heats the transfer layer through the mold 104 so that the transfer layer of the cylindrical substrate 102 has a sufficient thermoplastic property. While the transfer layer of the cylindrical substrate 102 is heated up to a required temperature, the transfer layer is pressed on the mold 104, so that the pattern of the mold 104 can be transferred to the transfer layer.

Now, operations of the nanoimprint apparatus 100 will be described with reference to FIG. 3. FIG. 3(a) illustrates a state of the nanoimprint apparatus 100 just after the start of nanoimprint. A position of the mold 104 is controlled by the stage 108 so that an end thereof is in contact with the cylindrical substrate 102. The cylindrical substrate 102 is pressed on the mold 104 through the shaft 112 and the shaft bearings 114 by the press machine 120. The cylindrical substrate 102 is heated up to a glass transition temperature through the mold 104 by the heater 110. Accordingly, a pattern of a contact portion of the mold 104 is transferred to a contact portion of the transfer layer that is in contact with the mold 104.

Subsequently, in the state that the cylindrical substrate 102 is pressed on the mold 104 by the press machine 120, the stage 108 moves the mold 104 in a horizontal direction 106. Although the shaft 112 is fixed to the cylindrical substrate 102, since the shaft 112 can rotate with respect to the shaft bearings 114, the cylindrical substrate 102 together with the shaft 112 rolls about the shaft bearings 114 and moves on the mold 104 due to a frictional force between the mold 104 and the transfer layer. The state is illustrated in FIGS. 3(b) and 3(c). The state of the rolling and moving of the cylindrical substrate 102 is indicated by the arrow 130. As shown in FIGS. 3(a) to 3(c), different portions of the transfer layer are pressed on different portions of the mold 104 according to the moving of the mold 104. As a result, the entire pattern formed on the plate mold 104 can be transferred to the transfer layer formed on the side surface of the cylindrical substrate 102. According to a search carried out by the applicant, any nanoimprint apparatus for a cylindrical to-be-molded body is not disclosed prior to the filing date of the present application.

As shown in FIG. 4(a), the pattern-transferred cylindrical substrate 102 together with the shaft is separated from the shaft bearings 114. Next, as shown in FIG. 4(b), the pattern-transferred cylindrical substrate 102 that is extracted from the shaft 112 can be used for a desired application. For example, if the transferred pattern is filled with a conductor by plating, a cylindrical circuit board can be fabricated.

Another transfer layer can be formed by coating a thermoplastic resin on the cylindrical side surface of the cylindrical substrate 102 on which circuits are formed, and another circuit pattern can be transferred to the new transfer layer by using the nanoimprint apparatus 100. By repeatedly performing the process, a multi-layered cylindrical circuit board can be fabricated. In the fabrication of the multi-layered circuit board, circuit patterns need to be transferred without misalignment of interlayer positions, which will be described later in an embodiment coping with the problem.

Second Embodiment

In a second embodiment, the embodiment in which transferred positions of a pattern on a cylindrical side surface are accurately controlled in nanoimprint on the cylindrical side surface will be described. Particularly, the second embodiment is useful for fabrication of a multi-layered circuit board. In the latter part of the description of the second embodiment, an example of a method of fabricating the multi-layered circuit board will be described.

FIG. 5 is a conceptual side view illustrating a cylindrical to-be-molded body 200 and a mold 204 according to the second embodiment of the present invention. FIG. 6A is a perspective view illustrating the cylindrical to-be-molded body 200. The to-be-molded body 200 includes a shaft 212 corresponding to the shaft 112 of the first embodiment. Although the shaft 212 has the same function as the shaft 112, the shaft 212 partially has a cut portion 205 unlike the shaft 112. A transfer layer 202 is formed by using a thermoplastic resin to surround the shaft 212. Although the transfer layer 202 corresponds to the cylindrical substrate 102 of the first embodiment, the transfer layer is not formed in the cut portion 205 as shown in FIGS. 5 and 6A unlike the cylindrical substrate 102. As shown in FIG. 6A, the cut portion 205 is formed in the transfer layer 202 and the shaft 212 in a shape of a groove that extends in an axial direction of the shaft 212.

In the second embodiment, a mold 204 is used as a substitute for the mold 104 of the first embodiment. The mold 204 includes a convex stria 207 which is to be engaged with the cut portion 205. Except for these features, the mold 204 has the same functions as the mold 104, and a pattern 209 which is to be transferred to the transfer layer 202 is formed on the mold 204.

The cut portion 205 has a shape in which an opening width is gradually decreased in the inward direction from an opening end. The convex stria 207 has a shape in which a cross section area is increased in the direction from a distal end to a base portion. Due to the shapes, when the transfer layer 202 and the mold 204 face each other, the convex stria 207 can be smoothly engaged with the cut portion 205.

The shaft 212, the transfer layer 202, and the mold 204 may be used for the nanoimprint apparatus 100 according to the first embodiment. Namely, the shaft 212 is rotatably supported by the shaft bearings 114, and the transfer layer 202 together with the shaft 212 is pressed on the mold 204 through the shaft bearings 114 by the press machine 120. The mold 204 is fastened and held by the stage 108 and moved in the horizontal direction.

In addition, although the cut portion 205 is formed as a shape of a groove as shown in FIG. 6A, the cut portion 205 may be formed as a shape of a hole as shown in FIG. 6B. FIG. 6B is a view illustrating a cylindrical to-be-molded body 200' according to a modified example of the cylindrical to-be-molded body 200. Reference numeral 202' denotes a transfer layer corresponding to the transfer layer 202 of FIG. 6A, and reference numeral 212' denotes a shaft corresponding to the shaft 212 of FIG. 6A. Two engagement holes 205' corresponding to the cut portion 205 of FIG. 6A are formed on the transfer layer 202'. In case of the to-be-molded body 200', as an engagement structure corresponding to the convex stria 207 formed on the mold 204, two protrusions corresponding to the engagement holes 205' are provided.

FIG. 7 is conceptual view illustrating operational states of a nanoimprint apparatus according to the second embodiment of the present invention. Before the transfer layer 202 is pressed on the mold 204, the transfer layer 202 is in contact with the mold 204, so that the cut portion 205 is engaged with the convex stria 207 (see FIG. 7(a)). Accordingly, position alignment between the transfer layer 202 and the mold 204 can be accurately performed. Subsequently, the transfer layer 202 together with the shaft 212 is pressed on the mold 204 in a direction 211 perpendicular to the surface of the mold 204 by the press machine 120. Namely, the transfer layer 202 is pressed on the mold 204. The stage 108 slowly moves the mold 204 in the horizontal direction 213. Since the shaft 212 is rotatably supported by the shaft bearings 114, the transfer layer 202 together with the shaft 212 is rolled and moved in the direction 215 in the state that the transfer layer 202 is pressed on the mold 204. Since the cut portion 205 and the convex stria 207 have the aforementioned shapes, the cut portion 205 and the convex stria 207 can be smoothly separated from each other. A portion of the transfer layer 202 that is in contact with the mold 204 is heated up to about the glass transition temperature through the mold 204 by the heater 110. As a result, the contact portion is deformed by the pattern 209, so that the pattern 209 can be transferred. As shown in FIGS. 7(b) to 7(d), the transfer layer 202 is rolled according to the moving of the mold 204, so that different portions of the transfer layer 202 are pressed on different portions of the mold 204. As a result, the entire pattern 209 formed on the plate mold 204 can be transferred to the cylindrical transfer layer 202 (see FIG. 7(d)).

An example of a method of fabricating a cylindrical multi-layered circuit board will be described with reference to FIGS. 8 and 9. FIG. 8 is a view illustrating a state that a new transfer layer is formed on the transfer layer 202 to which the pattern is transferred. FIG. 8(a) illustrates the to-be-molded body 200 to which the pattern 209 of the mold 204 is completely transferred, whereby a transferred pattern 221 is formed on the transfer layer 202. FIG. 8(b) illustrate a state that the layer 202 is coated with copper 222 by using an electroless plating process in order to form circuits of the layer 202 by filling a metal into the pattern 221. During the plating process, the cut portion 205 is covered with a protection jig 224 so that the cut portion 205 is not removed due to the plating process. Subsequently, a surface of the transfer layer 202 is polished to remove redundant plating, so that only the pattern 221 is filled with the copper. As a result, the circuits of the layer 202 are formed (see FIG. 8(c)). Next, the transfer layer 202 on which the circuits are formed is coated with a thermoplastic resin so as to form a new transfer layer 225 (see FIG. 8(d)). During the formation of the transfer layer 225, the cut portion 205 is also covered with the protection jig 224 so that the cut portion 205 may not be removed. Due to the protection jig 224, even though the new transfer layer 225 is formed, the cut portion 205 can remain without being removed (see FIG. 8(e)).

FIG. 9 is a view illustrating states that a new pattern is transferred to the to-be-molded body 200 fabricated in FIG. 8. For the transfer process, a mold 231 is used. As shown in FIG. 9(a), the mold 231 includes a to-be-transferred pattern 235 and a convex stria 233 which is to be engaged with the cut portion 205, similarly to the mold 204. Similarly to the transfer process for the transfer layer 202, the transfer layer 225 is in contact with the mold 231, so that the cut portion 205 is engaged with the convex stria 233 (see FIG. 9(b)). Accordingly, position alignment between circuits 223 and the mold 231 as well as position alignment between the transfer layer 225 and the mold 231 can be accurately performed. Namely, in the multi-layered circuit board fabricated according to the embodiment, accurate position alignment between upper-layer circuits and lower-layer circuits can be obtained. After the position alignment is performed by engaging the cut portion 205 with the convex stria 233, as shown in FIG. 7, the to-be-molded body 225 is rolled and moved in the state that the to-be-molded body 225 is pressed on the mold 231. As a result, the pattern 235 of the mold can be transferred to the transfer layer 225 as denoted by reference numeral 227 (see FIG. 9(c)).

The cylindrical multi-layered circuit board can be fabricated by repeatedly performing the processes shown in FIGS. 8 and 9. In addition, the multi-layered circuit board having accurate interlayer position alignment can be fabricated by performing the plating and the formation of transfer layer without removing of cut portion 205 and by using a set of molds having an engagement protrusion(s) engaged with the cut portion 205.

Third Embodiment

In a third embodiment, the cut portion 205 of the second embodiment is also formed by nanoimprint in fabrication of a cylindrical multi-layered circuit board. FIG. 10 is a view for explaining a nanoimprint method performed on a cylindrical side surface according to the third embodiment.

Referring to FIG. 10(a), similar to the to-be-molded bodies of the first and second embodiments, a to-be-molded body 300 has a structure in which a transfer layer 302 made of a resin is formed to surround a shaft 312. The shaft 312 may be replaced with the shaft 112 of the nanoimprint apparatus 100 of the first embodiment, and the shaft 312 is rotatably supported by the shaft bearings 114. The shaft 312 and the transfer layer 302 may be the same as the shaft 112 and the transfer layer formed on the side surface of the cylindrical substrate 102 according to the first embodiment.

The mold 304 used for the third embodiment includes a pattern 309 which is to be transferred to the transfer layer 302. Similar to the molds 204 and 231 used for the second embodiment, the mold 304 can be used for the nanoimprint apparatus 100 of the first embodiment and fastened and held by the stage 108. Unlike the convex stria 207 of the mold 204, the mold 304 has a convex stria 307 that is used to form a cut portion in the transfer layer 302.

In the transfer process for the to-be-molded body 300, the transfer layer 302 is firstly pressed by the convex stria 307 of the mold 304 (see FIG. 10(b)). Subsequently, in the state that the transfer layer 302 is pressed on the mold 304, the stage 108 moves the mold 304 in the horizontal direction (the leftward direction in the FIG. 10), so that the to-be-molded body 300 is rolled and moved on the mold 304 as indicated by an arrow 310 (see FIGS. 10(c) and 10(d)). FIG. 10(c) illustrates a state that the cut portion 315 and a transferred pattern 316 are formed on the transfer layer 302 by the convex stria 307 and the pattern 309, respectively.

Now, a multi-layering process for the to-be-molded body 300 will be described with reference to FIGS. 11 and 12. FIG. 11 is a view illustrating states that a new transfer layer is formed on the transfer layer 302 to which the pattern is transferred. Circuits 317 are formed on the to-be-molded body on which the transferred pattern 316 is formed according to FIGS. 10(b) to 10(d) (see FIG. 11(a)), by filling a metal into the transferred pattern 316 by using a plating process (see FIG. 11(b)). Next, a new transfer layer 322 is formed by coating a thermoplastic resin on the transfer layer 302 on which the circuits 317 are formed. During the plating process and the formation of the transfer layer 322, the cut portion 315 is covered with a protection jig 324 so that the cut portion 315 may not be removed.

FIG. 12 is a view illustrating states that a new pattern is transferred to the to-be-molded body 300 fabricated in FIG. 11. FIG. 12(a) illustrates a mold 331 which is used to transfer a pattern to the transfer layer 322. The mold 331 includes the pattern 333 which is to be transferred and a convex stria 332 which is to be engaged with the cut portion 315. In the transfer process for the transfer layer 322, the cut portion 315 is engaged with the convex stria 332. Accordingly, position alignment between the circuit pattern of the transfer layer 302 and the circuit pattern of the transfer layer 322 can be accurately performed. After the position alignment is performed by engaging the cut portion 315 with the convex stria 332, the transfer layer 322 is rolled and moved on the mold 331 in the state that the transfer layer 322 is pressed on the mold 331. As a result, the pattern of the mold 331 is transferred to the transfer layer 322.

Since a mold set comprising the mold having the position-alignment structure transfer portion for transferring the position-alignment concave structure to the to-be-molded body and the mold having the convex structure for being engaged with the concave structure is used, the multi-layered circuit board can be fabricated while the position alignment between the layers can be implemented.

Fourth Embodiment

A nanoimprint apparatus according to a fourth embodiment of the present invention will be described with reference to FIGS. 13 to 15. FIG. 13 is a conceptual view for explaining a principle of the nanoimprint apparatus according to the embodiment of the present invention. The nanoimprint apparatus 400 is an apparatus for transferring a pattern of a plate mold 404 to a cylindrical or columnar to-be-molded body 402. The to-be-molded body 402 comprises a transfer layer formed partially or entirely on a side surface of a cylindrical or columnar substrate as shown in FIGS. 6A and 6B. The pattern formed on a surface of the mold 404 is transferred to the transfer layer.

The nanoimprint apparatus 400 includes rollers 410 and 420 which are in contact with the to-be-molded body 402 and a frame 430 which rotatably supports the rollers 410 and 420. The roller 410 has a structure in which outer contact portions 411 and 412 are provided to both ends of a shaft 413. The outer contact portions 411 and 412 are directly in contact with the to-be-molded body 402, but the shaft 413 is not in contact with the to-be-molded body 402. The roller 420 has also a similar structure in which outer contact portions 421 and 422 are provided to both ends of a shaft 423. The outer contact portions 421 and 422 are directly in contact with the to-be-molded body 402, but the shaft 423 is not in contact with the to-be-molded body 402.

In the nanoimprint process, the frame 430 is pressed in a direction (indicated by the arrow 441) perpendicular to the surface of the mold 404 by a press machine (not shown). A pressing force is exerted through the outer contact portions 411, 412, 421, and 422 of the rollers 410 and 420 to the to-be-molded body 402. Accordingly, the transfer layer of the to-be-molded body 402 is pressed on the mold 404, so that the pattern is transferred. At this time, the transfer layer of the to-be-molded body 402 is heated through the mold 404 (or the substrate of the to-be-molded body 402) by a heater (not shown) up to a temperature at which the pattern can be transferred.

In the nanoimprint process, the mold 404 is slowly moved by a movable mechanism (not shown) in a direction perpendicular to the pressing force, that is, the direction (indicated by the arrow 442) parallel to the surface of the mold 404. Since the to-be-molded body 402 is columnar and is interposed between the rotatable rollers 410 and 420, the to-be-molded body 402 is rolled on the mold 404 due to a frictional force between the mold 404 and the to-be-molded body 402 in a direction of an arrow 444. At this time, although the outer contact portions 411, 412, 421, and 422 of the rollers 410 and 420 are closely in contact with the columnar to-be-molded body 402, since the rollers 410 and 420 are rotatably supported by the frame 430, the rollers 410 and 420 are also rolled in a direction indicated by the arrow 445 according to the rolling of the to-be-molded body 402 due to a frictional force between the to-be-molded body 402 and the outer contact portions 411, 412, 421, and 422. As a result, the to-be-molded body 402 can be pressed on the mold 404 in the state that the rollers 410 and 420 do not prevent the rolling and moving of the to-be-molded body 402 on the mold 404. In addition, a structure for increasing the frictional force between the to-be-molded body 402 and the mold 404 may be provided to some portions of the to-be-molded body 402 and the mold 404 so as to smoothly roll and move the to-be-molded body 402. Similarly, a structure for increasing the frictional force between the to-be-molded body 402 and the outer contact portions 411, 412, 421, and 422 may be provided to some portions of the to-be-molded body 402 and the outer contact portions 411, 412, 421, and 422 so as to smoothly roll the rollers 410 and 420 according to the rolling of the to-be-molded body 402. When the to-be-molded body 402 is rolled and moved on the mold 404 according to the moving of the mold 404, non-transferred portions of the transfer layer are pressed on different portions of the mold 404 sequentially. As a result, the nanoimprint is performed on the entire transfer layer formed on the cylindrical side surface. During the rolling and moving of the to-be-molded body 402, since only the both end portions, that is, the outer contact portions 411, 412, 421, and 422 of the rollers 410 and 420 are in contact with the to-be-molded body 402, unnecessary stress cannot be exerted on the transfer layer to which the pattern is transferred.

In the nanoimprint apparatus 400, by rolling and moving the to-be-molded body 402 on the mold 404 in the state that the to-be-molded body 402 is pressed on the mold 404, the pattern formed on the surface of the plate mold 404 can be transferred to the transfer layer partially or entirely formed on the cylindrical side surface. If the nanoimprint can be implemented in such a shape, various applications can be expected. For example, circuit wires (interconnections) can be formed on a circuit board in a shape of a cylindrical side surface, or grooves can be formed on a surface of a shaft-shaped member. As an example of the latter application, fine grooves can be formed on a surface of a shaft for a dynamic pressure shaft bearing. In addition, as another example of applications, a pattern for decoration may be simply transferred.

Now, a detailed example of the nanoimprint apparatus according to the fourth embodiment will be described in detail with reference to FIG. 14. FIG. 14(a) is a side view illustrating the nanoimprint apparatus 500 according to the embodiment, and FIG. 14(b) is a plan view illustrating the nanoimprint apparatus 500.

Similar to the nanoimprint apparatus 400, the nanoimprint apparatus 500 is an apparatus for transferring a pattern of a plate mold 504 to a to-be-molded body 502 in which a transfer layer is formed partially or entirely on a columnar substrate. The nanoimprint apparatus 500 includes rollers 510 and 520 corresponding to the rollers 410 and 420, a frame 530 corresponding to the frame 430, and a press machine 532 which presses the to-be-molded body 502 on the mold 504 through the rollers 510 and 520 and the frame 530. Similar to the rollers 410 and 420, the rollers 510 and 520 includes shafts which are not in contact with the to-be-molded body 502 and outer contact portions 511, 512, 521, and 522 which are provided to both ends of the shafts to be in contact with the to-be-molded body 502. The outer contact portions 511, 512, 521, and 522 correspond to the outer contact portions 411, 412, 421, and 422 of the rollers 410 and 420, and the shafts correspond to the shafts of the rollers 410 and 420.

In addition, the nanoimprint apparatus 500 further includes a stage 535 which holds the mold 504, a mounter 536 on which the stage 535 is supported, a threaded shaft 537 which is connected to the stage 535, and a motor 538 which is screw-coupled with the shaft 537. The stage 535 can be moved in the arrow direction 542 or 543 by rotating the shaft 537 clockwise or counterclockwise using motor 538. The stage 535 includes a heater therein so as to heat the transfer layer on the to-be-molded body 502 up to a glass transition temperature through the mold 504.

Now, operations of the nanoimprint apparatus 500 will be described with reference to FIG. 15. FIG. 15(a) illustrates a state just before the start of the nanoimprint. The mold 504 is fixed on the stage 535, and the to-be-molded body 502 having a columnar shape is set on the mold 504. The rollers 510 and 520 together with the frame 530 and the press machine 532 are lifted up by a lifter (not shown). FIG. 15(b) illustrates a state just after the start of the nanoimprint. The rollers 510 and 520 together with the frame 530 and the press machine 532 are lifted down by the lifter (not shown), so that the outer contact portions 511, 512, 521, and 522 of the rollers 510 and 520 are closely in contact with the to-be-molded body 502. The press machine 532 exerts load in a direction perpendicular to a surface of the mold 504 (see the arrow 541). The load is transmitted through the frame 530 and the rollers 510 and 520 to the to-be-molded body 502, so that the to-be-molded body 502 is pressed on the mold 504. In addition, the heater included in the stage 535 heats the transfer layer of the to-be-molded body 502 through the mold 504 up to a temperature at which a pattern can be transferred.

FIG. 15(c) illustrates a state where the nanoimprint is performed. The to-be-molded body 502 is pressed on the surface of the mold 504 through the frame 530 and the rollers 510 and 520 by the press machine 532. The shaft 537 is rotated by the motor 538, so that the stage 535 is moved in a direction of an arrow 542. Although the mold 504 is moved in the direction of the arrow 542 with respect to the to-be-molded body 502, since the to-be-molded body 502 is columnar shape and is interposed between the rotatable rollers 510 and 520, the to-be-molded body 502 is rolled on the mold 504 due to a frictional force between the mold 504 and the to-be-molded body 502 in a direction of an arrow 544. Accordingly, the rollers 510 and 520 are rolled in a direction of an arrow 545. While the to-be-molded body 502 is rolled and moved on the mold 504, a portion of the transfer layer of the to-be-molded body 502 where a pattern is not yet transferred is sequentially pressed on a new portion of the mold 504, so that the nanoimprint proceeds on the entire cylindrical transfer layer. A moving speed of the stage 535 needs to be suitably adjusted according to a property of the transfer layer so that the transfer can be sufficiently performed. FIG. 15(d) illustrates a state of the final step of the nanoimprint.

Fifth Embodiment

Now, a fifth embodiment of the present invention will be described with reference to FIGS. 16 to 18. FIG. 16 is a schematic view illustrating an outer appearance of a nanoimprint apparatus 1600 according to the fifth embodiment of the present invention. FIGS. 16(a) and 16(b) are side and front views, respectively. More specifically, FIG. 16(a) is a view as seen from the direction indicated by an arrow A of FIG. 16(b). FIG. 16(b) is a view as seen from the direction indicated by the arrow B of FIG. 16(a).

Similar to the aforementioned nanoimprint apparatus 100 or 400, the nanoimprint apparatus 1600 is an apparatus for transferring a pattern formed on a surface of a plate mold to a to-be-molded body in which a transfer layer is partially or entirely formed on a side surface of a cylindrical or columnar substrate. In the nanoimprint apparatus 1600, the plate mold 1612 is mounted on a movable stage 1604 and fastened by a mold fastening member thereof. The movable stage 1604 is disposed on a mounter 1602 to horizontally move the plate mold 1612 together with the mold fastening member. A columnar to-be-molded body 1616 is loaded on the plate mold 1612. A heater built in the mounter 1602 heats the transfer layer of the to-be-molded body 1616 through the movable stage 1604 and the mold 1612 during the nanoimprint process.

The to-be-molded body 1616 is a columnar to-be-molded body in which a transfer layer made of polyparaxylene is formed on a side surface of a columnar substrate made of stainless steel. Although the substrate may not be made of the stainless steel, a hard material is preferred. Although the transfer layer may not be made of polyparaxylene, a material capable of forming a uniform layer on the cylindrical side surface is preferred. In addition, in case of formation of a circuit pattern, the transfer layer is preferably made of a good insulating material.

The nanoimprint apparatus 1600 includes a press machine 1606 for pressing the to-be-molded body 1616 on the mold 1612 and an elastic plate 1608 interposed between the to-be-molded body 1616 and the press machine 1606. As shown in FIG. 16(b), widths of the press machine 1606 and the elastic plate 1608 in a longitudinal direction of the to-be-molded body 1616 are larger than a longitudinal width of the to-be-molded body 1616. The structure is provided in order to uniformly exert a pressing force of the press machine 1606 and the elastic plate 1608 on the columnar to-be-molded body 1616 in an axial direction thereof during the nanoimprint process. Due to the aforementioned structure, the nanoimprint apparatus 1600 can prevent the to-be-molded body 1616 from being bent when the to-be-molded body 1616 is pressed on the mold 1612. The elastic plate 1608 is made of an elastic material that is softer than the to-be-molded body 1616 so as to compensate for non-uniformity of the pressing force by using an elastic force thereof, so that a uniform pressing force can be exerted to the to-be-molded body 1616. In addition, the elastic plate 1608 is made of an elastic material having flexibility to be deformed suitably according to a pattern formed on the to-be-molded body 1616, so that the elastic plate 1608 can prevent the formed pattern from being destructed by the press machine 1606. As a material for the elastic plate 1608, a silicon rubber may be used.

Now, nanoimprint operations of the nanoimprint apparatus 1600 will be described with reference to FIGS. 17 and 18.

FIG. 17(a) illustrates a preparation step. The plate mold 1612 in which the to-be-transferred pattern 1614 is formed on the surface thereof is fastened on the movable stage 1604, and the columnar to-be-molded body 1616 in which the transfer layer is formed on the side surface thereof is loaded on the mold 1612. When the mold and the to-be-molded body are set at predetermined positions, the press machine 1606 is lifted down to a position where the plate 1608 is in contact with the to-be-molded body 1616 as shown in FIG. 17(b). In the next step, as shown in FIG. 17(c), the press machine 1606 is further lifted down to a position lower than the contact position of FIG. 17(b). Since the elastic plate 1608 is more flexible than the to-be-molded body 1616, the elastic plate 1608 is pressed to be deformed by the to-be-molded body 1616 as indicated by reference numeral 1608a, and the to-be-molded body 1616 is recessed with the elastic plate 1608. It should be noted that, for the convenience of description, the method of recessing the to-be-molded body 1616 with the elastic plate 1608 is exaggerated in FIG. 17(*c*).

In the next step, as shown in FIG. 18(*a*), by switching on the heater built in the mounter 1602, the nanoimprint apparatus 1600 heats the contact portion of the transfer layer of the to-be-molded body 1616 which is in contact with the mold 1612 through the stage 1604 and the mold 1612 up to a molding temperature. Subsequently, as shown in FIG. 18(*b*), the nanoimprint apparatus 1600 moves the stage 1604 in the state that the to-be-molded body 1616 is continuously pressed on the mold 1612 by the press machine 1606, so that the mold 1612 is horizontally moved in the leftward direction in the figure. Due to a frictional force between the transfer layer of the to-be-molded body 1616 and the to-be-transferred pattern 1614 of the mold 1612 or the elastic plate 1608, the to-be-molded body 1616 is rolled and moved on the mold 1612 according to the moving of the mold 1612. Therefore, according to the moving of the mold 1612, different portions of the transfer layer of the to-be-molded body 1616 are sequentially pressed on the mold 1612, so that the pattern transfer is performed entirely on the cylindrical side surface of the to-be-molded body 1616. When the pattern transfer is completed, the heater of the mounter 1602 is switched off, and the press machine 1606 is lifted up so as to extract the columnar molded body 1616 (see FIG. 18(*c*)).

As shown in FIG. 18(*b*), each portion of the transfer layer of the to-be-molded body 1616 that is pressed on the mold 1612 is detached from the mold 1612 according to the rolling of the to-be-molded body 1616. Subsequently, the detached portion of the transfer layer is cured by air cooling while moving upwards to gradually approach the plate 1608. If the plate 1608 is made of a material harder than the to-be-molded body 1616, the transferred, molded pattern may be destructed as soon as the pattern is in contact with the plate 1608. However, in the nanoimprint apparatus 1600, since the plate 1608 is made of a material softer than the transfer layer of the to-be-molded body 1616, the pattern cannot be destructed. Namely, since the plate 1608 can be deformed suitably according to a pattern formed on the transfer layer of the to-be-molded body 1616, the plate 1608 has a function of preventing the pattern from being destructed.

According to the nanoimprint apparatus 1600, an ultrafine pattern can be stably formed on a cylindrical side surface of a flexible cylindrical or columnar to-be-molded body having an ultrafine diameter or the like.

While the present invention has been particularly shown and described with reference to exemplary embodiments thereof, the present invention is not limited thereto, but various changes in form and details may be made therein without departing from the spirit and scope of the present invention as defined by the appended claims. For example, although plate molds are exemplified as the molds in the embodiments, curved-surface molds may be employed in the present invention. In addition, although a concave groove and a convex stria having triangular cross sections are exemplified as engagement structures for position alignment between the transfer layer and the mold in the embodiments, the present invention is not limited thereto. For example, as the concave structure, conic, trigonal-pyramid, or quadrangular-pyramid concave structures or groove (furrows) structures having a cross section of a triangle or a trapezoid may be used. As the convex structures, conic, trigonal-pyramid, or quadrangular-pyramid protrusions or convex striae (striated line or ridgeline) having a cross section of a triangle or a trapezoid may be used. In addition, although the transfer layer that is formed substantially entirely on the cylindrical side surface of the to-be-molded body is exemplified in the embodiments, the present invention is not limited thereto. It can be understood by the ordinarily skilled in the art that the transfer layer may be formed partially on the conic or cylindrical side surface of the to-be-molded body for the nanoimprint.

BRIEF DESCRIPTION OF THE DRAWINGS

FIGS. 3(*a*)-(*c*) are conceptual views illustrating operational states of the nanoimprint apparatus 100.

FIGS. 4(*a*) and (*b*) are schematic views illustrating a cylindrical substrate 102 to which a pattern is transferred.

FIG. 6A is a perspective view illustrating the cylindrical to-be-molded body 200.

FIGS. 8(*a*)-(*e*) are views illustrating states that a new transfer layer is formed on a transfer layer 202 to which a pattern is transferred.

FIGS. 9(*a*)-(*c*) are views illustrating states that a new pattern is transferred to a to-be-molded body 200 fabricated in FIG. 8.

FIGS. 11(*a*)-(*c*) are views illustrating states that a new transfer layer is formed on a transfer layer 302 to which a pattern is transferred.

FIGS. 14(*a*) and (*b*) are conceptual views illustrating a detailed example of the nanoimprint apparatus according to the fourth embodiment of the present invention.

REFERENCE NUMERALS

Figure 1:
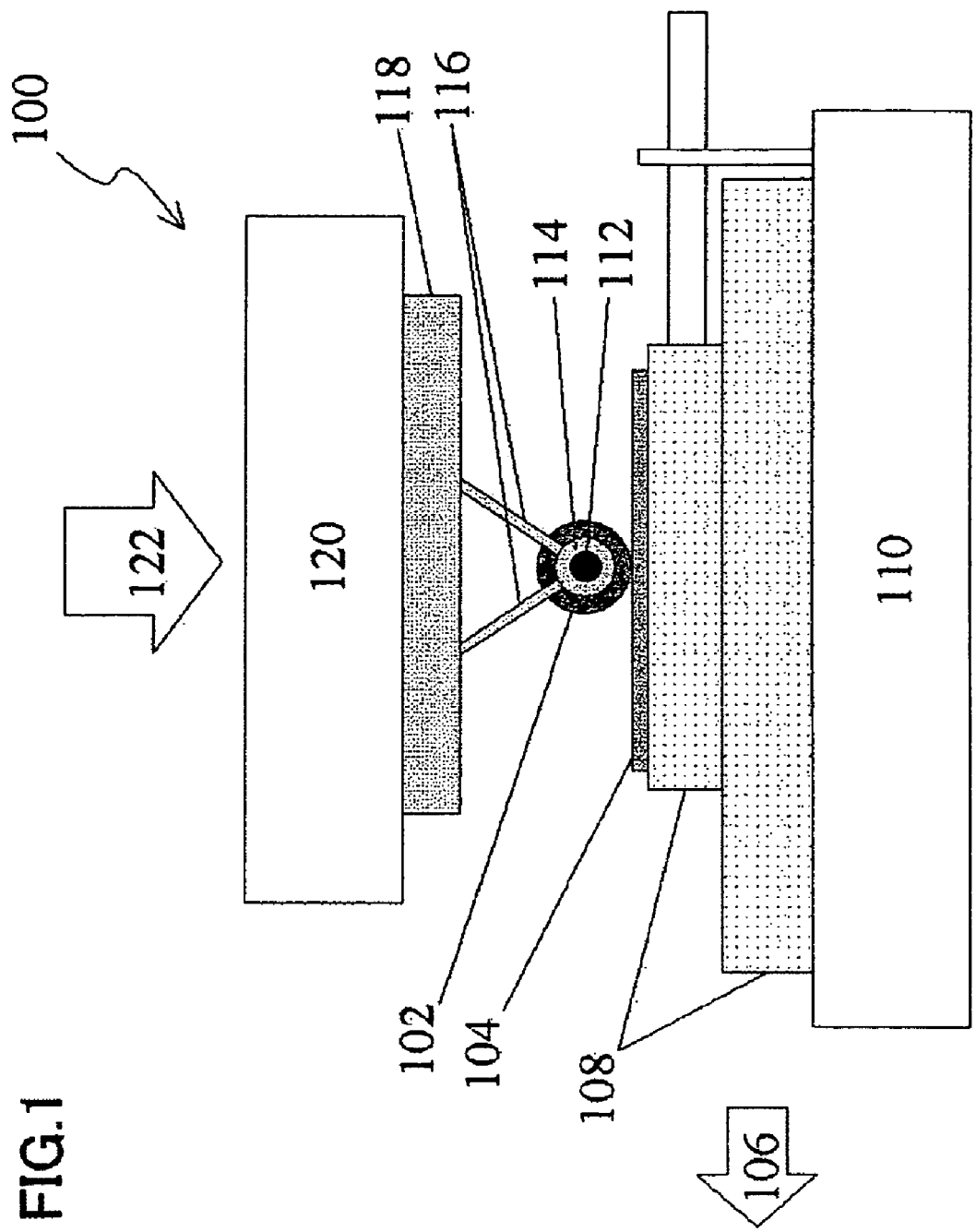
FIG. 1 is a conceptual side view illustrating a nanoimprint apparatus 100 according to a first embodiment of the present invention.
Figure 2:
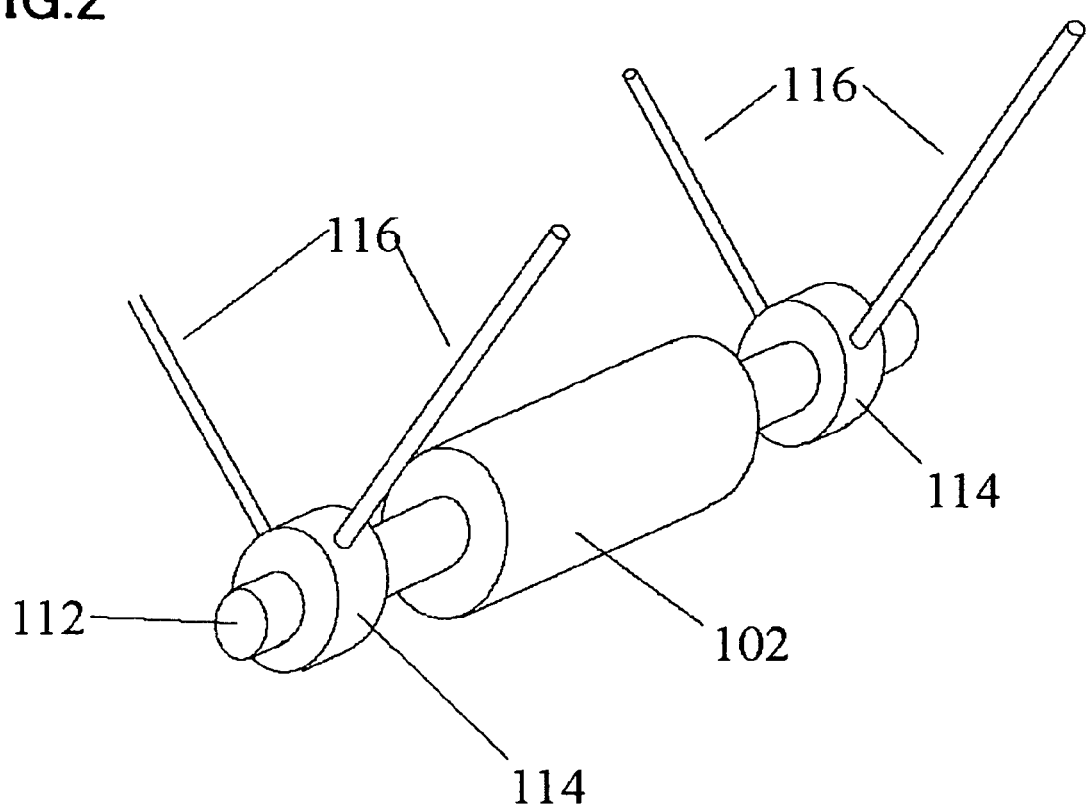
FIG. 2 is a partially enlarged perspective view illustrating the nanoimprint apparatus 100.
Figure 5:
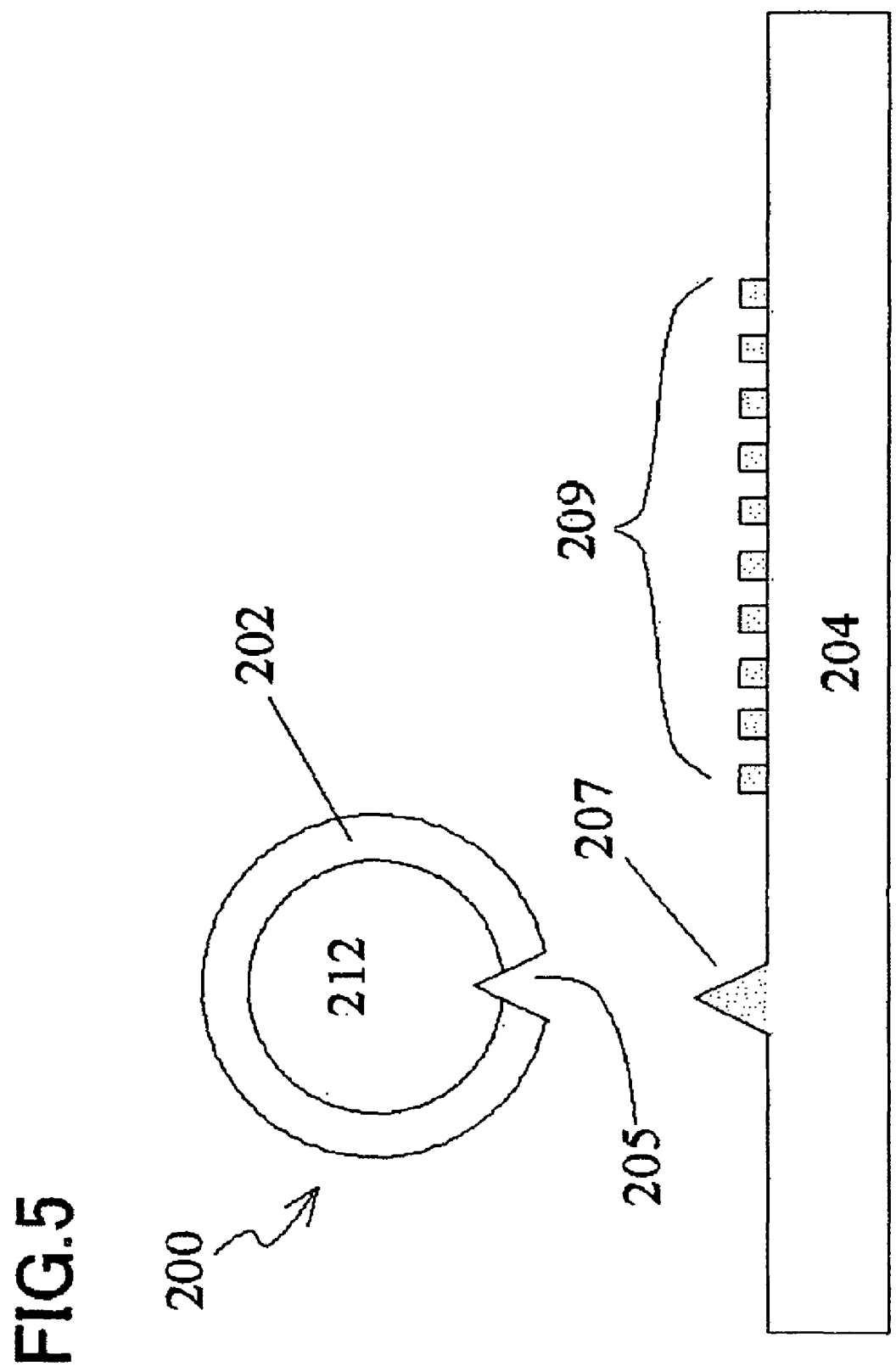
FIG. 5 is a conceptual side view illustrating a cylindrical to-be-molded body 200 and a mold 204 according to a second embodiment of the present invention.
Figure 6B:
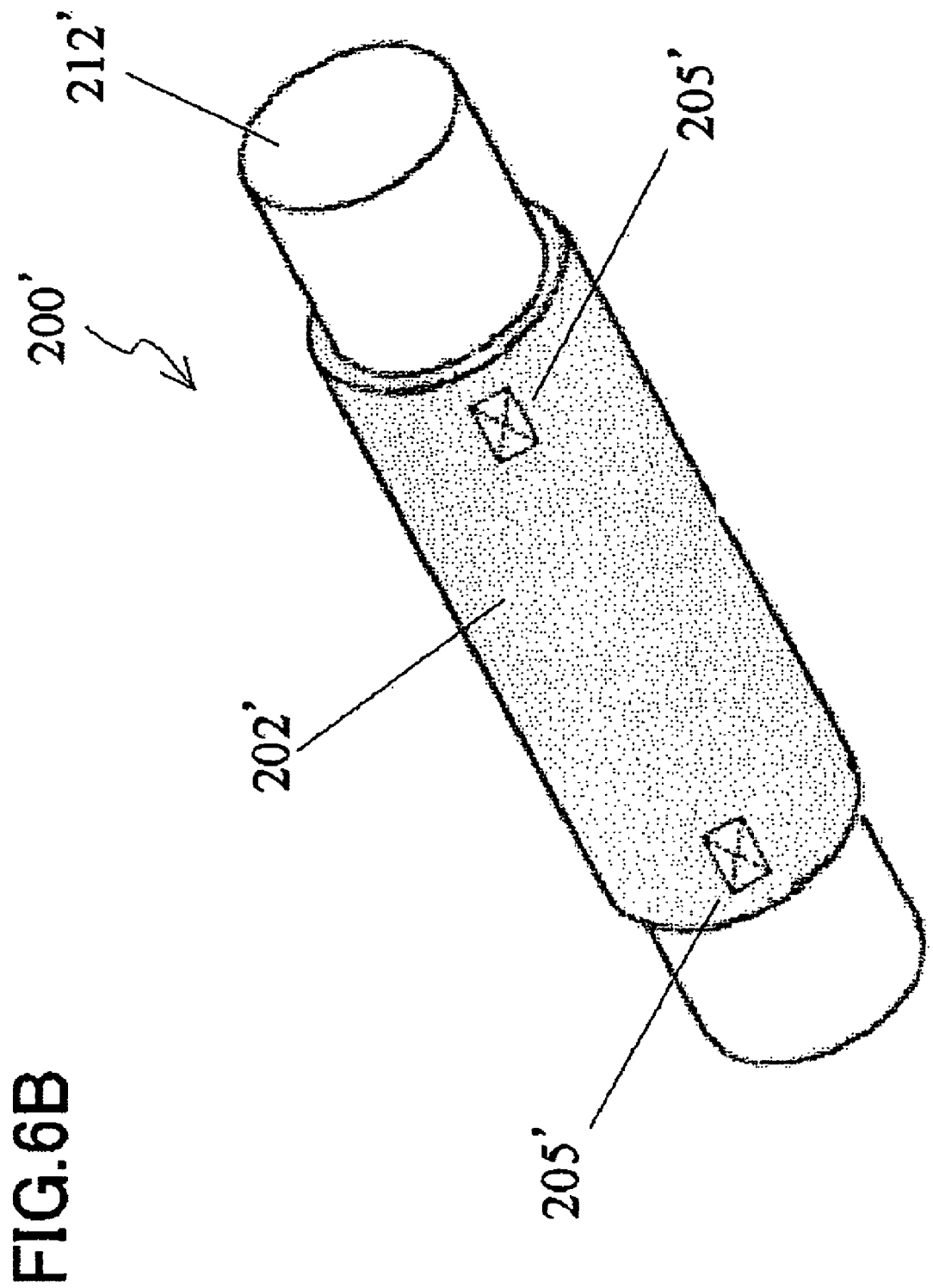
FIG. 6B is a view illustrating a cylindrical to-be-molded body according to a modified example of the cylindrical to-be-molded body 200.
Figure 7:
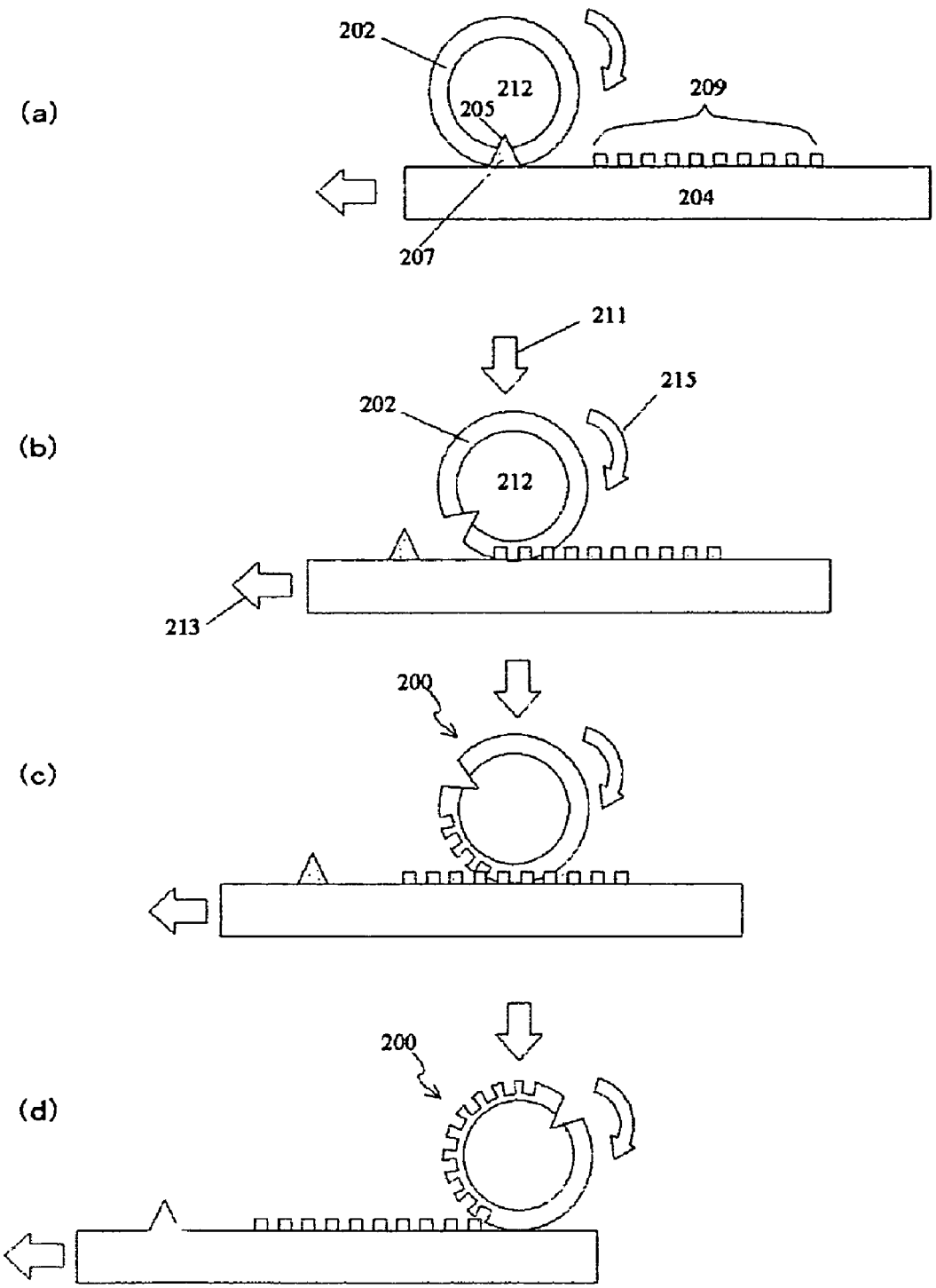
FIGS. 7(*a*)-(*d*) are conceptual views illustrating operational states of a nanoimprint apparatus according to the second embodiment of the present invention.
Figure 10:
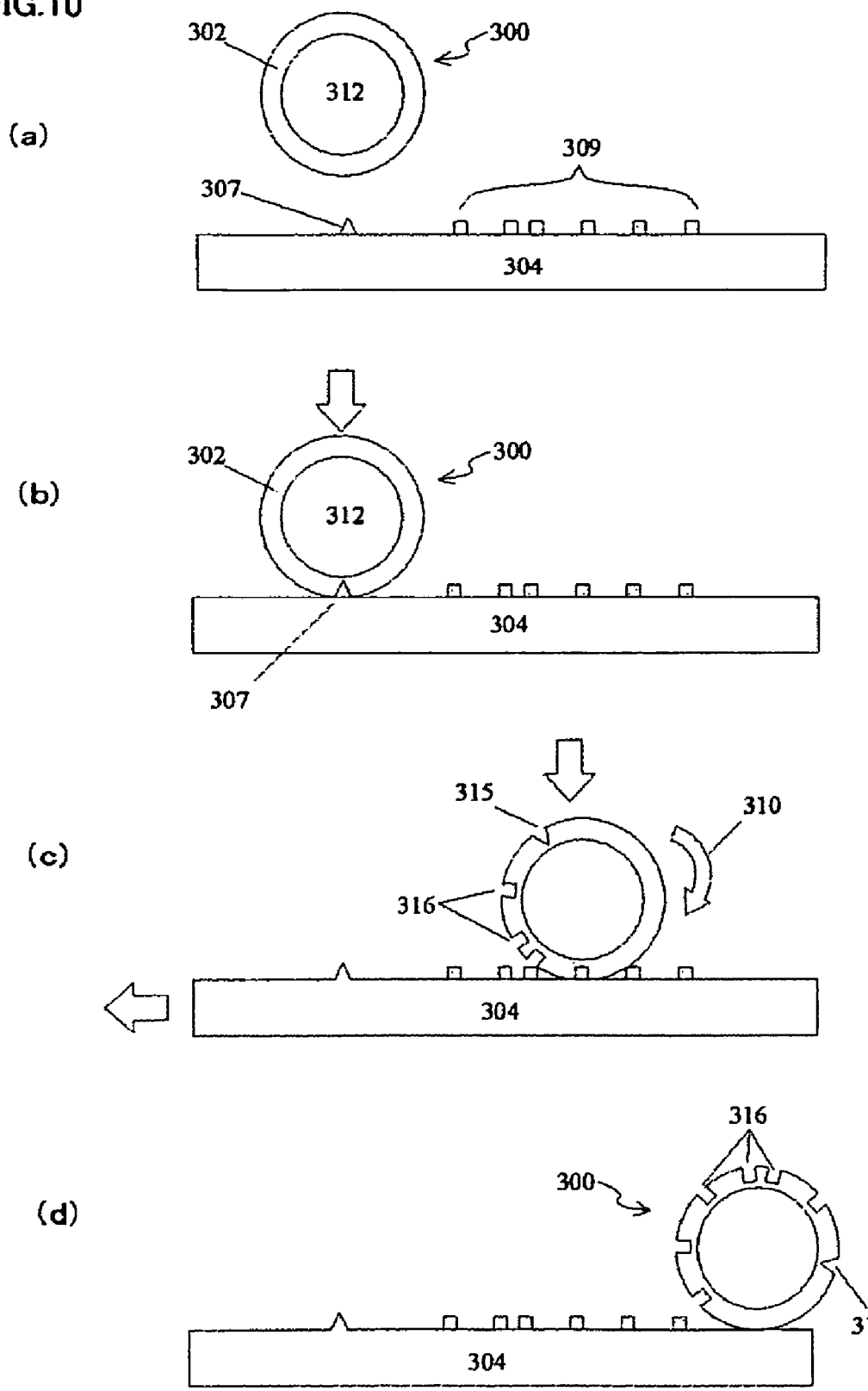
FIGS. 10(*a*)-(*d*) are views for explaining a nanoimprint method performed on a cylindrical side surface according to a third embodiment of the present invention.
Figure 12:
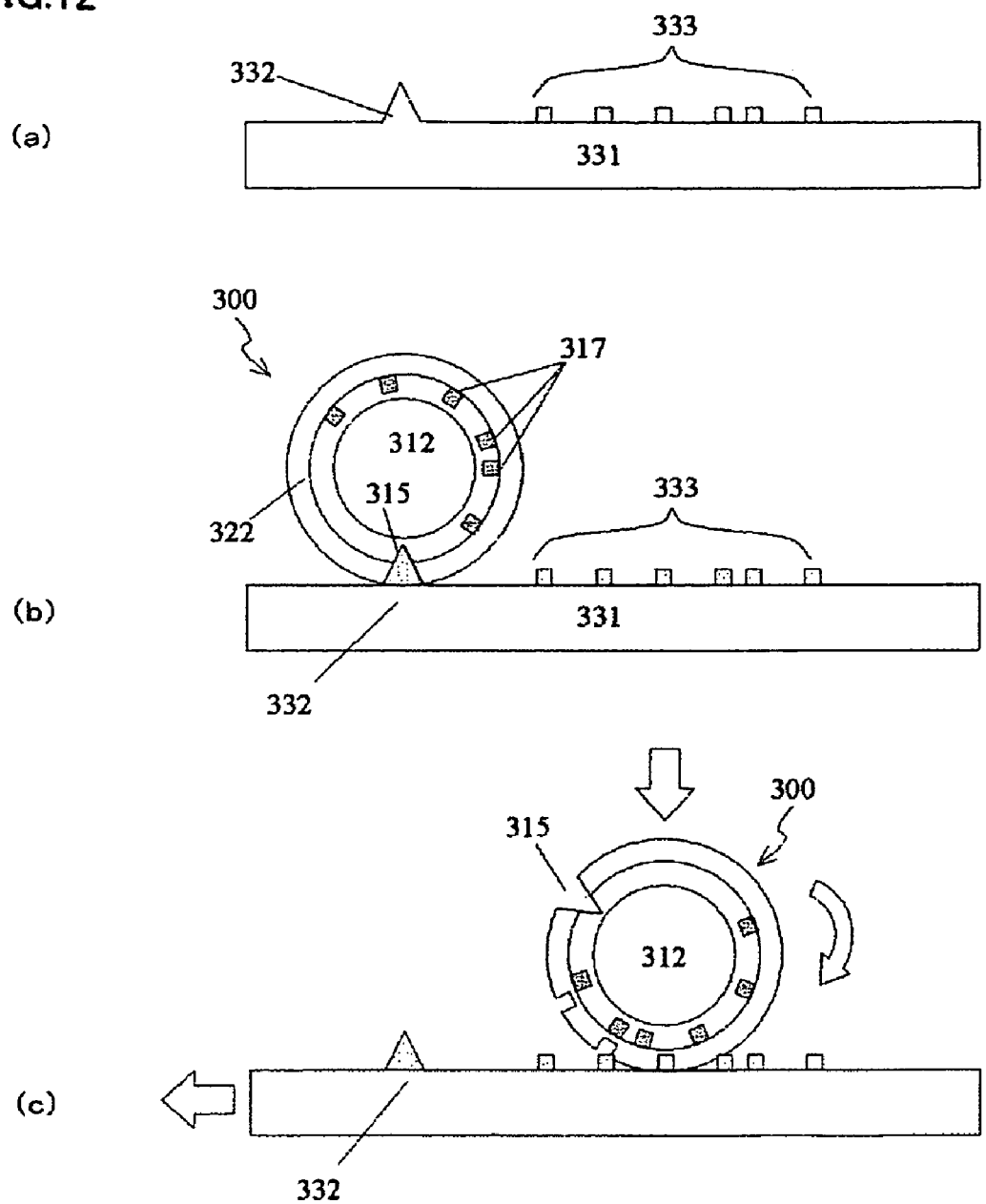
FIGS. 12(*a*)-(*c*) are views illustrating states that a new pattern is transferred to a to-be-molded body 300 fabricated in FIG. 11.
Figure 13:
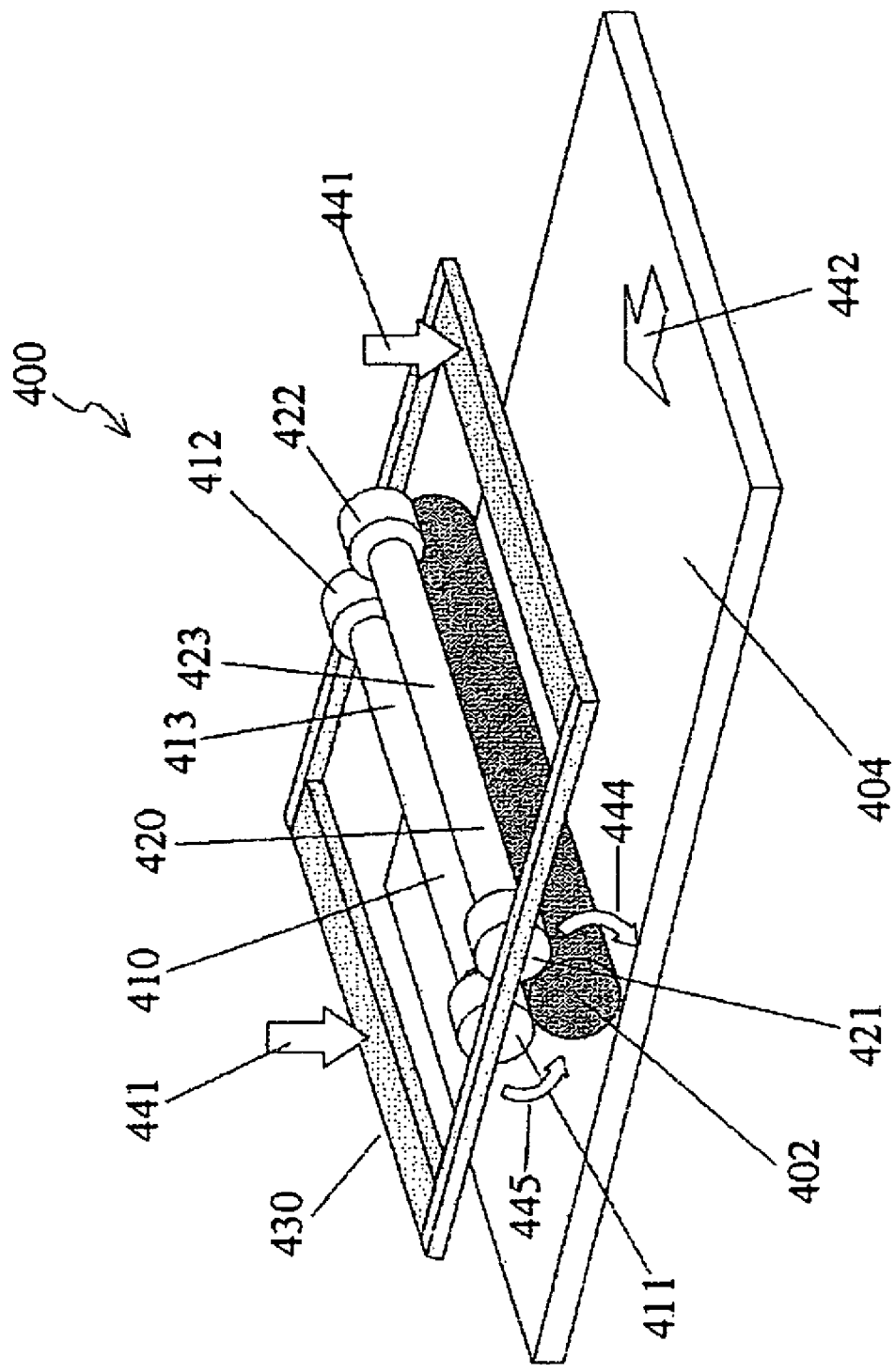
FIG. 13 is a conceptual view for explaining a principle of a nanoimprint apparatus according to a fourth embodiment of the present invention.
Figure 15:
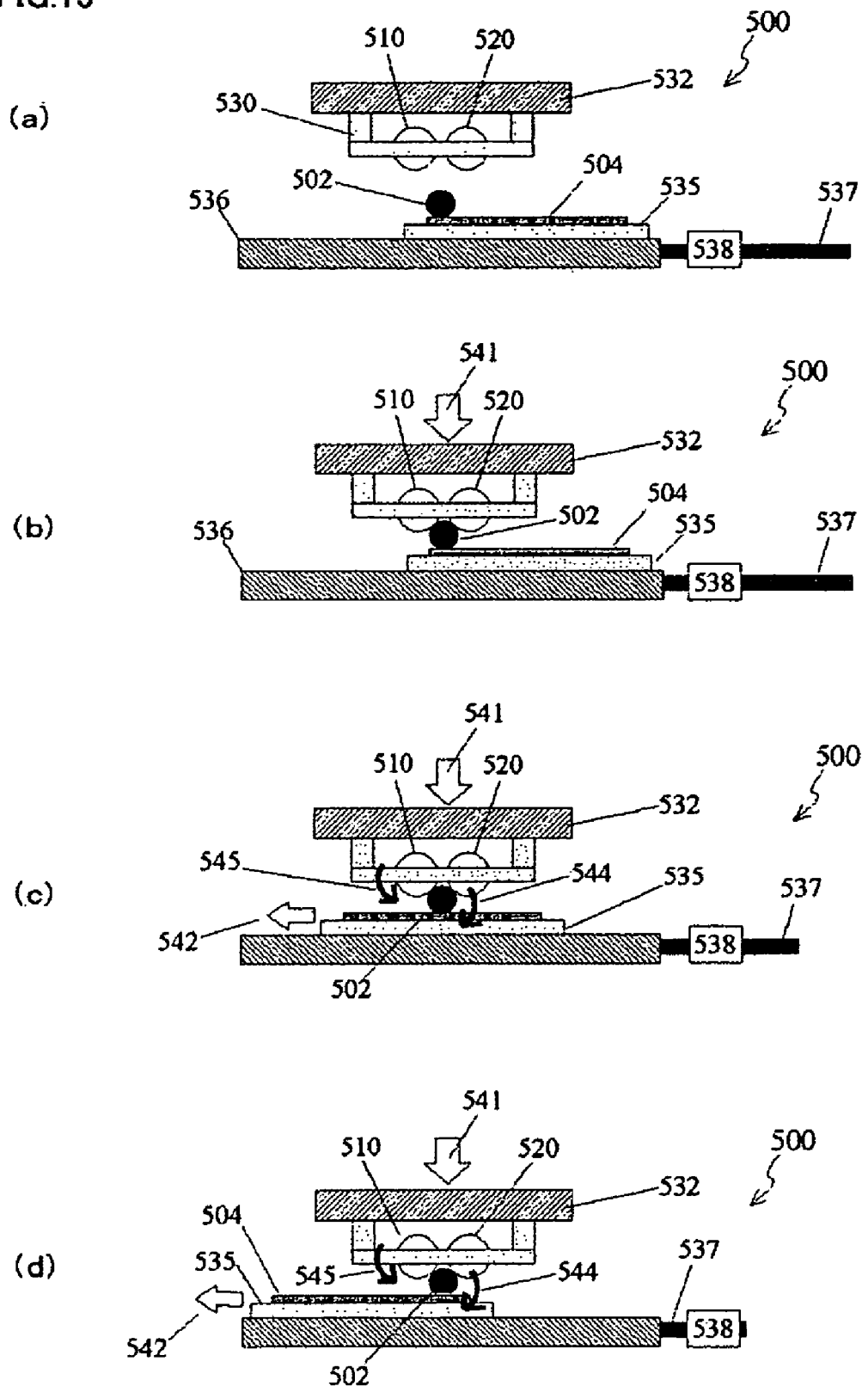
FIGS. 15(*a*)-(*d*) are views for explaining operations of the nanoimprint apparatus according to the fourth embodiment of the present invention.
Figure 16:
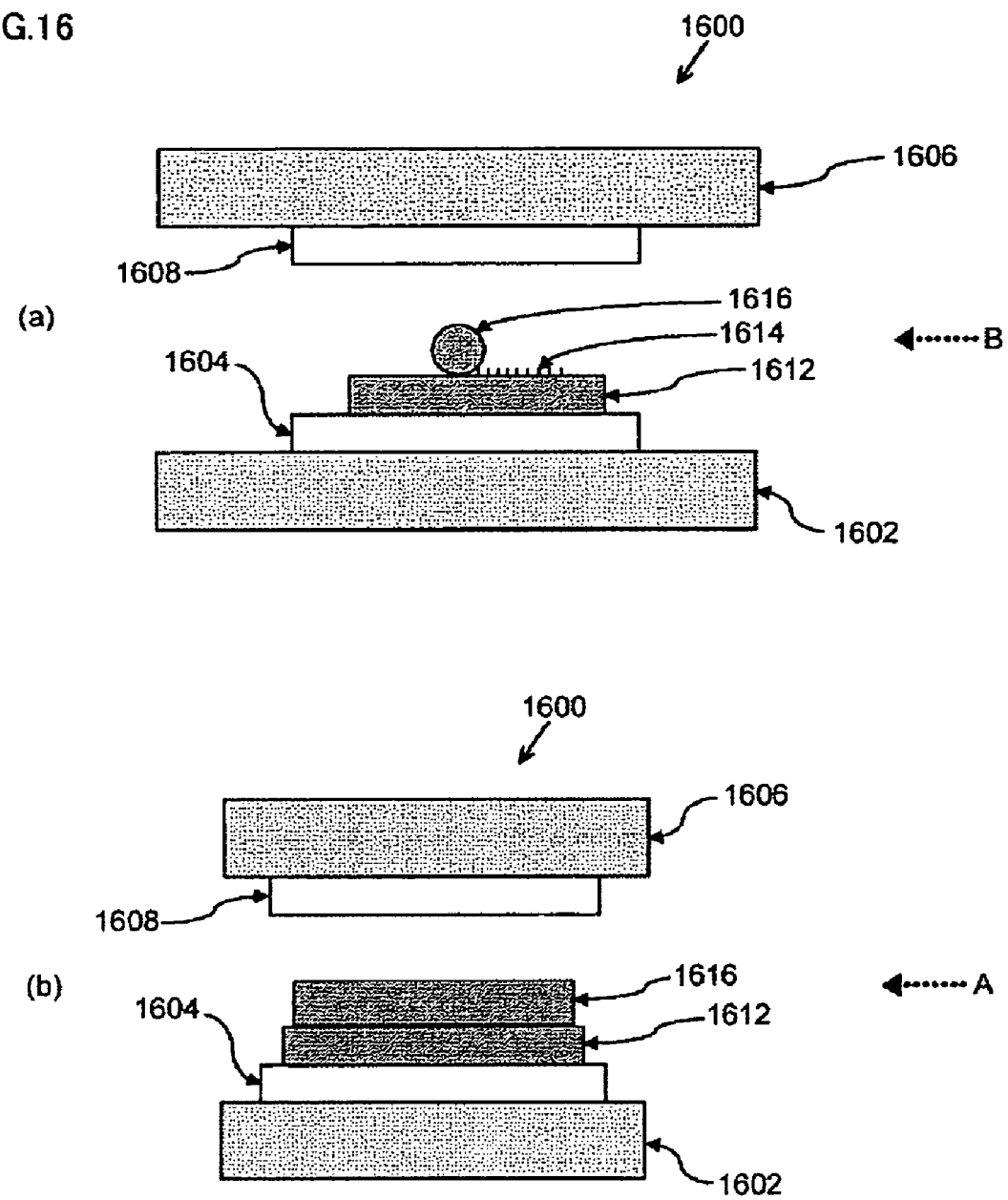
FIGS. 16(*a*) and (*b*) are schematic views illustrating an outer appearance of a nanoimprint apparatus 1600 according to a fifth embodiment of the present invention.
Figure 17:
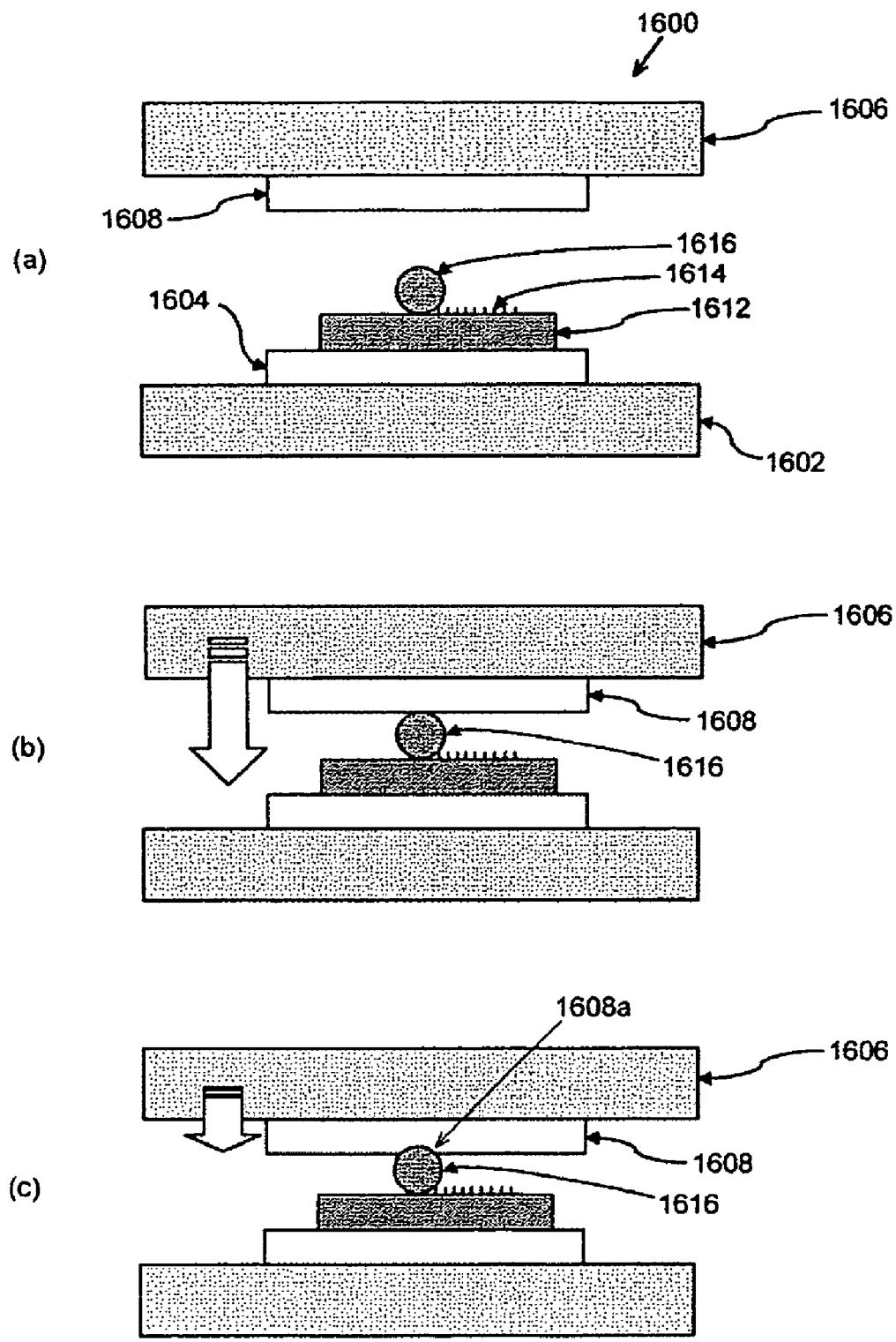
FIGS. 17(*a*)-(*c*) are views for explaining operations of the nanoimprint apparatus 1600.
Figure 18:
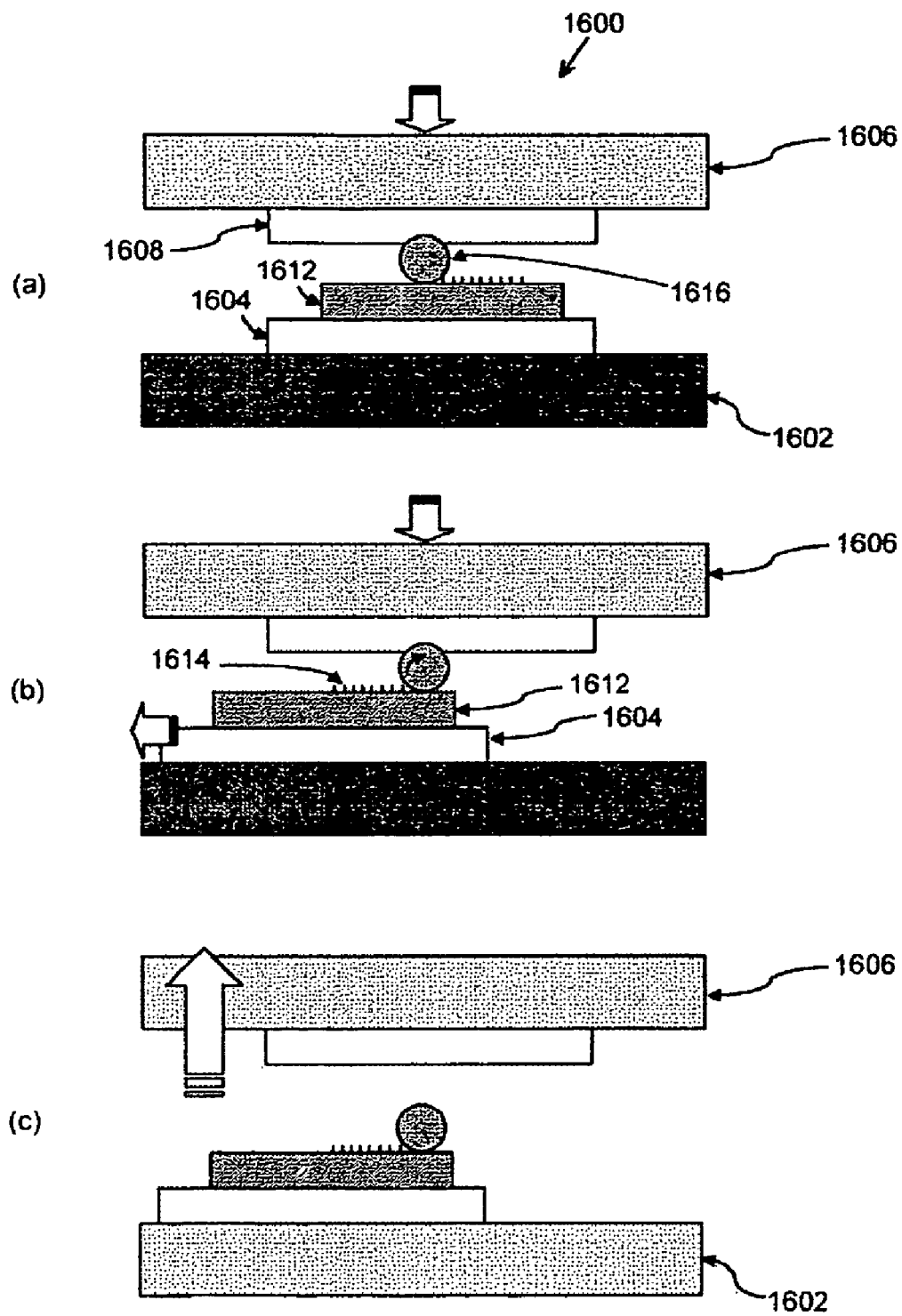
FIGS. 18(*a*)-(*c*) are views for explaining operations of the nanoimprint apparatus 1600.

100: nanoimprint apparatus
102: cylindrical substrate
104: mold
108: stage
110: heater
112: shaft
114: shaft bearing
118: cylindrical-member fastening jig
120: press machine
200: cylindrical to-be-molded body 202: transfer layer
204: mold
207: convex stria
1600: nanoimprint apparatus
1604: movable stage
1602: mounter
1606: press machine
1608: elastic plate
1612: plate mold
1616: to-be-molded body

The invention claimed is:

1. A method of fabricating a cylindrical or columnar molded body in which a pattern is formed partially or entirely on a side surface thereof by nanoimprint, the method comprising steps of:

preparing a to-be-molded body, in which a transfer layer is formed partially or entirely on a side surface of a substantially cylindrical or columnar substrate, and a plate mold for nanoimprint, in which a to-be-transferred pattern is formed on a surface thereof;

fastening the plate mold on a horizontally movable stage;

positioning the to-be-molded body on the plate mold;

pressing the to-be-molded body on the plate mold through an elastic layer having a width equal to or larger than a longitudinal width of the to-be-molded body and being made of an elastic material softer than the transfer layer; and moving the plate mold by the stage such that the to-be-molded body is continuously pressed on the mold, and such that the to-be-molded body is rolled and moved.

* * * * *